(12) United States Patent
Singh et al.

(10) Patent No.: US 11,581,165 B2
(45) Date of Patent: *Feb. 14, 2023

(54) MULTI-ZONE GAS DISTRIBUTION SYSTEMS AND METHODS

(71) Applicant: Applied Materials, Inc., Santa Clara, CA (US)

(72) Inventors: Saravjeet Singh, Sunnyvale, CA (US); Kenneth D. Schatz, Los Altos, CA (US); Alan Tso, San Jose, CA (US); Marlin Wijekoon, Palo Alto, CA (US); Dimitri Kioussis, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 80 days.

This patent is subject to a terminal disclaimer.

(21) Appl. No.: 17/157,224

(22) Filed: Jan. 25, 2021

(65) Prior Publication Data

US 2021/0265134 A1 Aug. 26, 2021

Related U.S. Application Data

(63) Continuation of application No. 15/847,411, filed on Dec. 19, 2017, now Pat. No. 10,903,054.

(51) Int. Cl.
*H01J 37/32* (2006.01)
*H01L 21/02* (2006.01)
*H01L 21/311* (2006.01)

(52) U.S. Cl.
CPC .................. *H01J 37/32449* (2013.01); *H01J 37/32862* (2013.01); *H01L 21/02049* (2013.01);

(Continued)

(58) Field of Classification Search
CPC ........... H01J 37/32449; H01J 37/32862; H01J 37/32357; H01J 37/3244; H01L 21/02049;

(Continued)

(56) References Cited

U.S. PATENT DOCUMENTS 5,595,606 A 1/1997 Fujikawa et al.
10,043,674 B1 * 8/2018 Korolik ............. H01J 37/32357

(Continued)

FOREIGN PATENT DOCUMENTS

JP 2007-535819 A 12/2007
JP 2008-227064 A 9/2008

(Continued)

OTHER PUBLICATIONS

International Search Report and Written Opinion dated Apr. 12, 2019 in International Patent Application No. PCT/US2018/066276, 8 pages.

(Continued)

*Primary Examiner* — Bilkis Jahan
*Assistant Examiner* — Victor V Barzykin
(74) *Attorney, Agent, or Firm* — Kilpatrick Townsend & Stockton LLP

(57) ABSTRACT

The present technology includes improved gas distribution designs for forming uniform plasmas during semiconductor processing operations or for treating the interior of semiconductor processing chambers. While conventional gas distribution assemblies may receive a specific reactant or reactant ratio which is then distributed into the plasma region, the presently described technology allows for improved control of the reactant input distribution. The technology allows for separate flows of reactants to different regions of the plasma to offset any irregularities observed in process uniformity. A first precursor may be delivered to the (Continued)

center of the plasma above the center of the substrate/pedestal while a second precursor may be delivered to an outer portion of the plasma above an outer portion of the substrate/pedestal. In so doing, a substrate residing on the pedestal may experience a more uniform etch or deposition profile across the entire surface.

20 Claims, 15 Drawing Sheets

(52) U.S. Cl.
CPC .............. *H01J 2237/335* (2013.01); *H01J 2237/3323* (2013.01); *H01J 2237/3344* (2013.01); *H01L 21/02274* (2013.01); *H01L 21/31116* (2013.01)

(58) Field of Classification Search
CPC ........... H01L 21/3065; C23C 16/45565; C23C 16/50
See application file for complete search history.

(56) References Cited

U.S. PATENT DOCUMENTS

| | | | | |
|---|---|---|---|---|
| 10,903,054 | B2* | 1/2021 | Singh | H01J 37/32862 |
| 2004/0238123 | A1* | 12/2004 | Becknell | H01J 37/32844 156/345.33 |
| 2007/0163440 | A1 | 7/2007 | Kim et al. | |
| 2012/0122302 | A1 | 5/2012 | Weidman et al. | |
| 2012/0171852 | A1* | 7/2012 | Yuan | H01L 21/0262 118/723 R |
| 2013/0199729 | A1* | 8/2013 | Ishida | H01J 37/3244 156/345.34 |
| 2014/0227881 | A1 | 8/2014 | Lubomirsky et al. | |
| 2014/0256131 | A1* | 9/2014 | Wang | H01L 21/32135 438/676 |
| 2015/0007770 | A1 | 1/2015 | Chandrasekharan et al. | |
| 2017/0229289 | A1 | 8/2017 | Lubomirsky et al. | |
| 2017/0338133 | A1* | 11/2017 | Tan | H01L 21/3065 |

FOREIGN PATENT DOCUMENTS

| | | |
|---|---|---|
| JP | 2013-239482 A | 11/2013 |
| JP | 2016-223009 A | 12/2016 |
| KR | 10-0447142 B1 | 9/2004 |
| KR | 2007-0045513 A | 5/2007 |
| KR | 20130136962 A | 12/2013 |
| KR | 20150056631 A | 5/2015 |
| KR | 2015-0115780 A | 10/2015 |
| TW | 2006-07016 A | 2/2006 |
| TW | 2009-46236 A | 11/2009 |
| TW | 2014-38103 A | 10/2014 |
| TW | 2017-12145 A | 4/2017 |

OTHER PUBLICATIONS

International Preliminary Report on Patentability dated Jun. 23, 2020 in International Patent Application No. PCT/US2018/066276, 6 pages.

* cited by examiner

MULTI-ZONE GAS DISTRIBUTION SYSTEMS AND METHODS

CROSS-REFERENCE TO RELATED APPLICATIONS

The present application is a continuation of U.S. patent application Ser. No. 15/847,411, filed Dec. 19, 2017, the contents of which are hereby incorporated by reference in their entirety for all purposes.

TECHNICAL FIELD

The present technology relates to components and apparatuses for semiconductor manufacturing. More specifically, the present technology relates to gas distribution assemblies and methods of operation.

BACKGROUND

Integrated circuits are made possible by processes which produce intricately patterned material layers on substrate surfaces. Producing patterned material on a substrate requires controlled methods for forming and removing material. The uniformity of a plasma used to excite reactants may directly impact the final product. Plasma uniformity fluctuations in a remote plasma may result in regions of high etch or deposition rate near the edge of a substrate relative to the center or vice versa. Etch uniformity has been controlled by adjusting the spacing between the substrate surface and a showerhead but etch rate is also altered. Depending on the degree of variation along the surface of the substrate, device failure may occur due to the inconsistencies produced by the etch process.

Additionally, plasma uniformity has been found to exhibit instability especially in the presence of fluorine and other electronegative species. Electronegative species may not relinquish electrons as readily which makes the maintenance of a symmetric plasma more difficult. A plasma which is symmetric about the surface of the substrate enables an etch process to be made more uniform.

Thus, there is a need for improved systems and methods that can be used to produce high quality devices and structures. These and other needs are addressed by the present technology.

SUMMARY

The present technology includes improved gas distribution designs for forming uniform plasmas during semiconductor processing operations or for treating the interior of semiconductor processing chambers. While conventional gas distribution assemblies may receive a specific reactant or reactant ratio which is then distributed into the plasma region, the presently described technology allows for improved control of the reactant input distribution. The technology allows for separate flows of reactants to different regions of the plasma to offset any irregularities observed in process uniformity. A first precursor may be delivered to the center of the plasma above the center of the substrate/pedestal while a second precursor may be delivered to an outer portion of the plasma above an outer portion of the substrate/pedestal. In so doing, improved operations may be performed because a substrate residing on the pedestal can experience a more uniform etch or deposition profile across the entire surface.

In some embodiments, a zonal distribution manifold has two separate channels for precursors which are supplied to two separate regions of a zonal distribution plate. The zonal distribution plate may provide a first gas to the inner portion of a zonal blocker plate and may provide a second gas to the outer portion of a zonal blocker plate. The inner portion may have an inner showerhead which is centered within the zonal blocker plate. The inner showerhead may be circular. The outer portion may have an outer showerhead which is centered about the zonal blocker plate and may have an annular shape around the inner showerhead. When assembled so that all elements are affixed to one another, the first gas and the second gas are kept separate until after passing through the zonal blocker plate.

Benefits of the devices described herein include an ability to adjust the gases which are delivered to the center of a local or remote plasma in comparison to the gases which are delivered to the outer portion of the plasma. Substrate processing plasmas are very thin but still need to provide a uniform net effect across the substrate surface or around the interior of the substrate processing system for cleaning procedures. Etching and cleaning often rely on highly electronegative reactants such as fluorine-containing precursors. Fluorine exacerbates plasma uniformity problems because it has such a high electronegativity. Fluorine ions are very hard to create so there are a dearth of electrons available to maintain the plasma throughout the thin and wide plasma region—some regions may maintain an electronic breakdown cascade to the detriment of the plasma health in other portions of the plasma region. The hardware described herein can provide the benefit of making the plasma more uniform and/or may provide the benefit of making the process (e.g. the removal rate) more uniform across the plasma region (across the dimensions perpendicular to the thin dimension). In some cases, the hardware described herein may even be used to avoid a skewed plasma which would have collapsed to one side of the plasma region. Thus, the hardware and methods described herein may be used to form a concentric plasma which benefits plasma control efforts and makes the process more uniform as well.

Embodiments disclosed include substrate processing systems. The substrate processing systems include a zonal distribution manifold having a first manifold channel and a second manifold channel. The substrate processing systems further include a zonal distribution plate affixed to the zonal distribution manifold. The zonal distribution plate has an inner zone channel configured to receive a first gas from the first manifold channel and an outer zone channel configured to receive a second gas from the second manifold channel. The substrate processing systems further include a zonal blocker plate affixed to the zonal distribution plate. The zonal blocker plate has a top inner recess configured to receive the first gas from the inner zone channel and a top outer recess configured to receive the second gas from the outer zone channel. The zonal blocker plate further includes a bottom inner recess fluidly coupled to the top inner recess through an inner showerhead portion and further includes a bottom outer recess fluidly coupled to the top outer recess through an outer showerhead portion. The substrate processing systems further include a faceplate affixed to the zonal blocker plate having through-holes configured to pass the first gas and the second gas into a plasma region.

The outer zone channel may include a groove formed in a top portion of the zonal distribution plate. The zonal distribution plate may include a plurality of bottom holes evenly arranged along a circle centered around the zonal blocker plate. The groove may be configured to receive the second gas from the second manifold channel at a starting point. The path length from the starting point, along the groove to each of the plurality of bottom holes may be the same for each of the plurality of bottom holes. The plurality of bottom holes may include at least eight bottom holes. The zonal distribution manifold, the zonal distribution plate and the zonal blocker plate may be configured such that the first gas and the second gas do not mix until entering the plasma region. The substrate processing systems may further include a showerhead parallel to the faceplate. The plasma region may be disposed between the faceplate and the showerhead. The plasma region may abut each of the faceplate and the showerhead. The substrate processing systems may further include a substrate processing region bordering the showerhead on the opposite side of the showerhead from the plasma region. The plasma region may be a local plasma region configured to house a substrate for processing. The zonal distribution plate and the zonal blocker plate may be shaped like disks and are coaxial. The first manifold channel may include a narrow channel portion and a wide channel portion disposed nearer to the zonal distribution plate. The narrow channel portion has a first diameter and the wide channel portion has a second diameter and the second diameter is larger than the first. The first manifold channel may be configured to allow the first gas to expand and mix before entering the top inner recess.

Embodiments disclosed include processing methods. The methods include applying an RF power between an anode and a cathode. The anode and the cathode are planar and parallel and a plasma region is disposed between the anode and the cathode. The anode and the cathode each border or abut the plasma region. The methods include forming a hydrogen-containing plasma by flowing a hydrogen-containing precursor into a center of the plasma region. The methods include forming a hydrogen-and-fluorine-containing plasma by further flowing a fluorine-containing precursor into the plasma region. The hydrogen-containing precursor and the fluorine-containing precursor first encounter one another and combine in the plasma region. The methods include forming a fluorine-containing plasma by halting the flow of the hydrogen-containing precursor into the plasma region.

The processing methods may process a substrate or interior surfaces of a substrate processing chamber. The anode may be a faceplate or a showerhead and the cathode may be the showerhead or the faceplate. A substrate processing region may be disposed on the opposite side of the showerhead from the plasma region. In another embodiment, the anode may be a showerhead or a substrate pedestal and the cathode may be the substrate pedestal or the showerhead. A substrate processing region may be disposed between the anode and the cathode. The substrate processing region may border or abut both the anode and the cathode. The anode, the cathode and the plasma region may be circular. The hydrogen-containing precursor may include one of hydrogen ($H_2$) and ammonia ($NH_3$). The fluorine-containing precursor may include nitrogen trifluoride ($NF_3$).

Embodiments disclosed include semiconductor processing systems. The semiconductor processing systems include a zonal distribution manifold having a first manifold channel and a second manifold channel. The semiconductor processing systems include a zonal distribution plate affixed to the zonal distribution manifold. The zonal distribution plate has an inner zone channel configured to receive a first gas from the first manifold channel and an outer zone channel configured to receive a second gas from the second manifold channel. The semiconductor processing systems include a zonal blocker plate affixed to the zonal distribution plate. The zonal blocker plate has a central through-hole configured to receive the first gas from the inner zone channel and a top outer recess configured to receive the second gas from the outer zone channel. The zonal blocker plate further includes a bottom outer recess fluidly coupled to the top outer recess through an outer showerhead portion. The semiconductor processing systems further include a faceplate affixed to the zonal blocker plate. The faceplate has through-holes configured to pass the second gas into a plasma region. The zonal blocker plate has a central faceplate hole configured to receive the first gas from the central through-hole and pass the first gas into the plasma region.

The zonal distribution manifold, the zonal distribution plate and the zonal blocker plate may be configured such that the first gas and the second gas do not mix until entering the plasma region. The semiconductor processing systems may further include a showerhead parallel to the faceplate. The plasma region may be disposed between the faceplate and the showerhead. The plasma region may border each of the faceplate and the showerhead. The semiconductor processing systems may further include a substrate processing region bordering the showerhead on the opposite side of the showerhead from the plasma region. The plasma region may be a local plasma region configured to house a substrate for processing. The zonal distribution plate may include a plurality of bottom holes arranged evenly along a circle centered around the zonal blocker plate. The zonal distribution plate and the zonal blocker plate may be circular and may be coaxial.

Embodiments disclosed include plasma processing methods. The methods include forming a hydrogen-and-fluorine-containing plasma by applying an RF power between an anode and a cathode. A plasma region containing each of a hydrogen-containing precursor and a fluorine-containing precursor is disposed between the anode and the cathode. The anode and the cathode are planar and parallel to one another. The methods further include forming a fluorine-containing plasma by removing the hydrogen-containing precursor from the plasma region. The anode may be a faceplate or a showerhead and the cathode may be the other element (the showerhead or the faceplate). A substrate processing region may be disposed on the opposite side of the showerhead from the plasma region. In another embodiment, the anode may be a showerhead or a substrate pedestal and the cathode may be the substrate pedestal or the showerhead (the remaining element of the two). A substrate processing region may be disposed between the anode and the cathode. The substrate processing region may border both the anode and the cathode. The anode, the cathode and the plasma region may be circular. The hydrogen-containing precursor may include at least one of hydrogen ($H_2$) and ammonia ($NH_3$). The fluorine-containing precursor may include nitrogen trifluoride ($NF_3$).

BRIEF DESCRIPTION OF THE DRAWINGS

A further understanding of the nature and advantages of the disclosed technology may be realized by reference to the remaining portions of the specification and the drawings.

Figure 1:
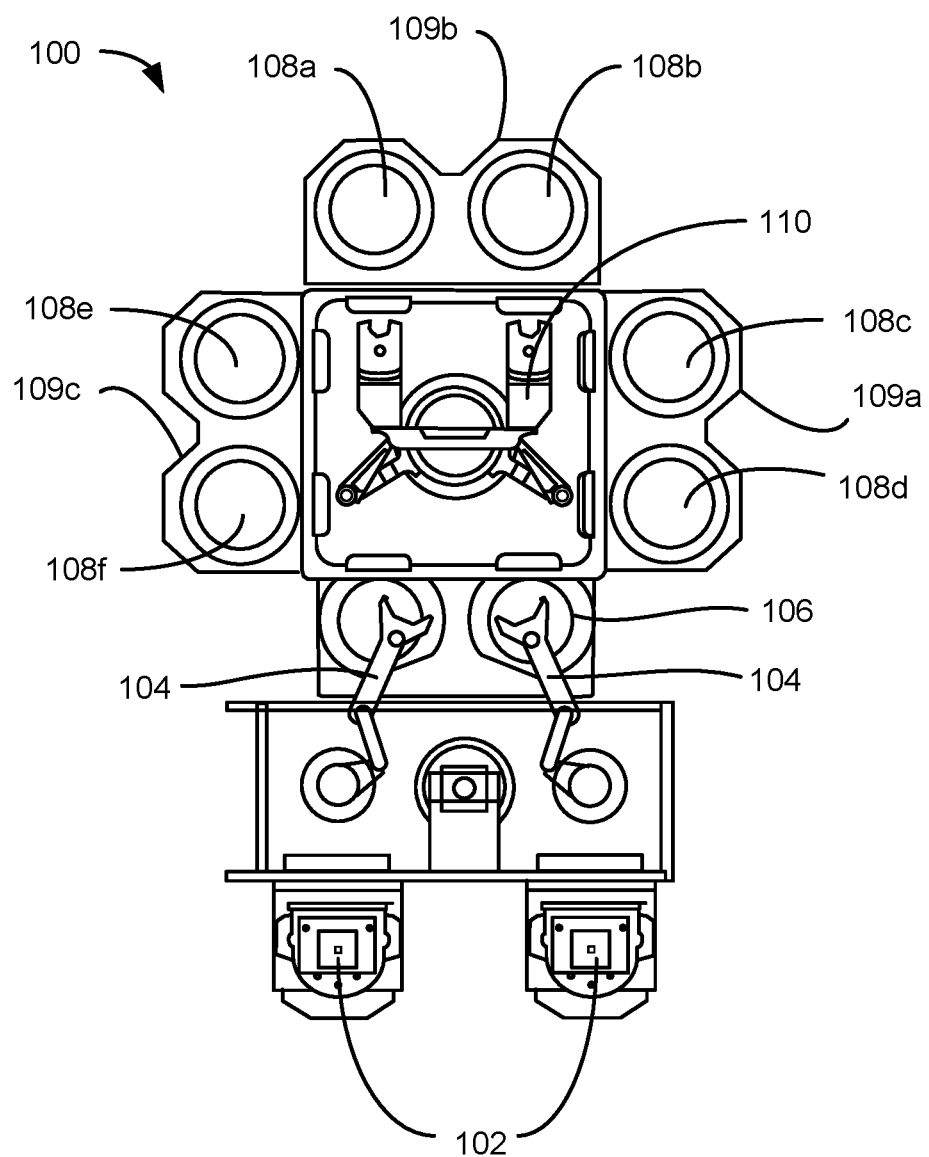
FIG. 1 shows a top plan view of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes improved gas distribution designs for forming uniform plasmas during semiconductor processing operations or for treating the interior of semiconductor processing chambers. While conventional gas distribution assemblies may receive a specific reactant or reactant ratio which is then distributed into the plasma region, the presently described technology allows for improved control of the reactant input distribution. The technology allows for separate flows of reactants to different regions of the plasma to offset any irregularities observed in process uniformity. A first precursor may be delivered to the center of the plasma above the center of the substrate/pedestal while a second precursor may be delivered to an outer portion of the plasma above an outer portion of the substrate/pedestal. In so doing, improved operations may be performed because a substrate residing on the pedestal can experience a more uniform etch or deposition profile across the entire surface. These and other benefits will be explained in detail below.

Benefits of the devices described herein include an ability to adjust the concentration of gases near the center of a local or remote plasma compared to the gases away from the center or near the edge of the plasma. Substrate processing plasmas are very thin and difficult to maintain especially when a preponderance of the gases flowed into the plasma contain a highly electronegative atom such as fluorine. Argon is often added to help initially strike a plasma but thin plasma regions may still not support a healthy, stable, concentric plasma because of the space constraints. Argon is so heavy that sputtering may undesirably damage or reduce the lifespan of interior components of the substrate processing chamber. Helium is used to even out a plasma but does not improve the initial strikability and subsequent stability of the plasma. Positively-charged fluorine ions are very hard to create so the electron concentration stays low even during the plasma—some regions may maintain an electronic breakdown cascade to the detriment of the plasma health in other portions of the plasma region. The hardware described herein can provide the benefit of making the plasma more uniform and/or may provide the benefit of making the process (e.g. the removal rate) more uniform across the plasma region (across the dimensions perpendicular to the thin dimension). In some cases, the hardware described herein may even be used (along with the processes described herein) to avoid an off-center "collapsed" plasma which has been observed with fluorine plasmas. Thus, the hardware and methods described herein may be used to form a concentric plasma which benefits plasma control efforts and makes the process more uniform as well.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone. The disclosure will discuss one possible system and chamber that can be used with the present technology to perform certain removal operations before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
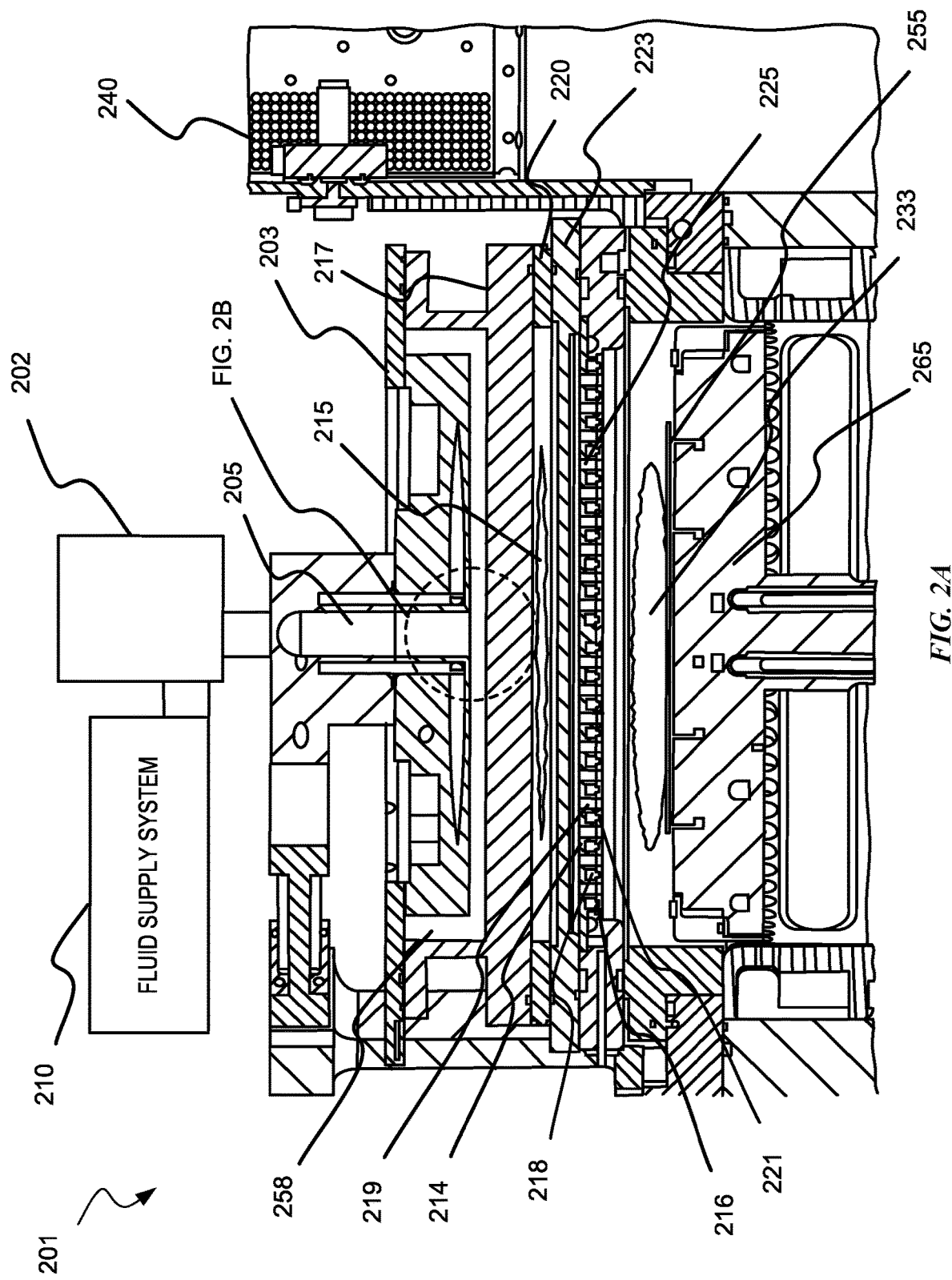
FIG. 2A shows a schematic cross-sectional view of an exemplary processing chamber according to embodiments of the present technology.

FIG. 2A shows a cross-sectional view of an exemplary process chamber system 201 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 202 may optionally be included in the system, and may process a first gas which then travels through gas inlet assembly 205. The inlet assembly 205 may include two or more distinct gas supply channels where the second channel (not shown) may bypass the RPS 202, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 202, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma.

In embodiments, an ion suppressor (which may be the showerhead) may be used to provide radical and/or neutral species for gas-phase etching. The ion suppressor may also be referred to as an ion suppression element. In embodiments, for example, the ion suppressor is used to filter etching plasma effluents en route from the remote plasma region to the substrate processing region. The ion suppressor may be used to provide a reactive gas having a higher concentration of radicals than ions. Plasma effluents pass through the ion suppressor disposed between the remote plasma region and the substrate processing region. The ion suppressor functions to dramatically reduce or substantially eliminate ionic species traveling from the plasma generation region to the substrate. The ion suppressors described herein are simply one way to achieve a low electron temperature in the substrate processing region during the gas-phase etch processes described herein.

In embodiments, an electron beam is passed through the substrate processing region in a plane parallel to the substrate to reduce the electron temperature of the plasma effluents. A simpler showerhead may be used if an electron beam is applied in this manner. The electron beam may be passed as a laminar sheet disposed above the substrate in embodiments. The electron beam provides a source of neutralizing negative charge and provides a more active means for reducing the flow of positively charged ions towards the substrate and increasing the etch selectivity in embodiments. The flow of plasma effluents and various parameters governing the operation of the electron beam may be adjusted to lower the electron temperature measured in the substrate processing region.

The electron temperature may be measured using a Langmuir probe in the substrate processing region during excitation of a plasma in the remote plasma. The electron temperature may be less than 0.5 eV, less than 0.45 eV, less than 0.4 eV, or less than 0.35 eV. These extremely low values for the electron temperature are enabled by the presence of the electron beam, showerhead and/or the ion suppressor. Uncharged neutral and radical species may pass through the electron beam and/or the openings in the ion suppressor to react at the substrate. Such a process using radicals and other neutral species can reduce plasma damage compared to conventional plasma etch processes that include sputtering and bombardment. Embodiments of the present invention are also advantageous over conventional wet etch processes where surface tension of liquids can cause bending and peeling of small features.

The substrate processing region may be described herein as "plasma-free" during the etch processes described herein. "Plasma-free" does not necessarily mean the region is devoid of plasma. Ionized species and free electrons created within the plasma region may travel through pores (apertures) in the partition (showerhead) at exceedingly small concentrations. The borders of the plasma in the chamber plasma region may encroach to some small degree upon the substrate processing region through the apertures in the showerhead. Furthermore, a low intensity plasma may be created in the substrate processing region without eliminating desirable features of the etch processes described herein. All causes for a plasma having much lower intensity ion density than the chamber plasma region during the creation of the excited plasma effluents do not deviate from the scope of "plasma-free" as used herein.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. In embodiments, the plasma formed in substrate processing region 233 may be a DC biased plasma formed with the pedestal acting as an electrode. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
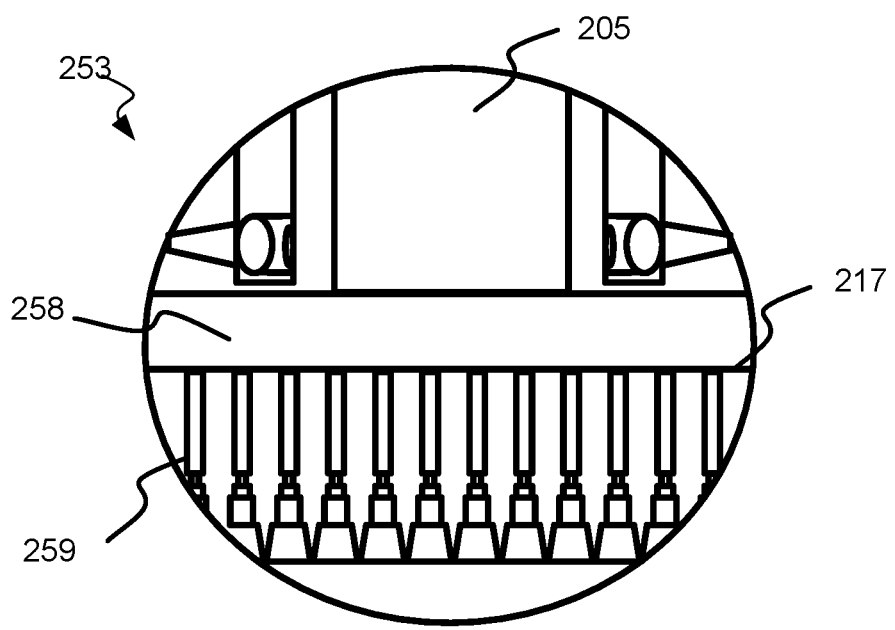
FIG. 2B shows a detailed view of an exemplary showerhead according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
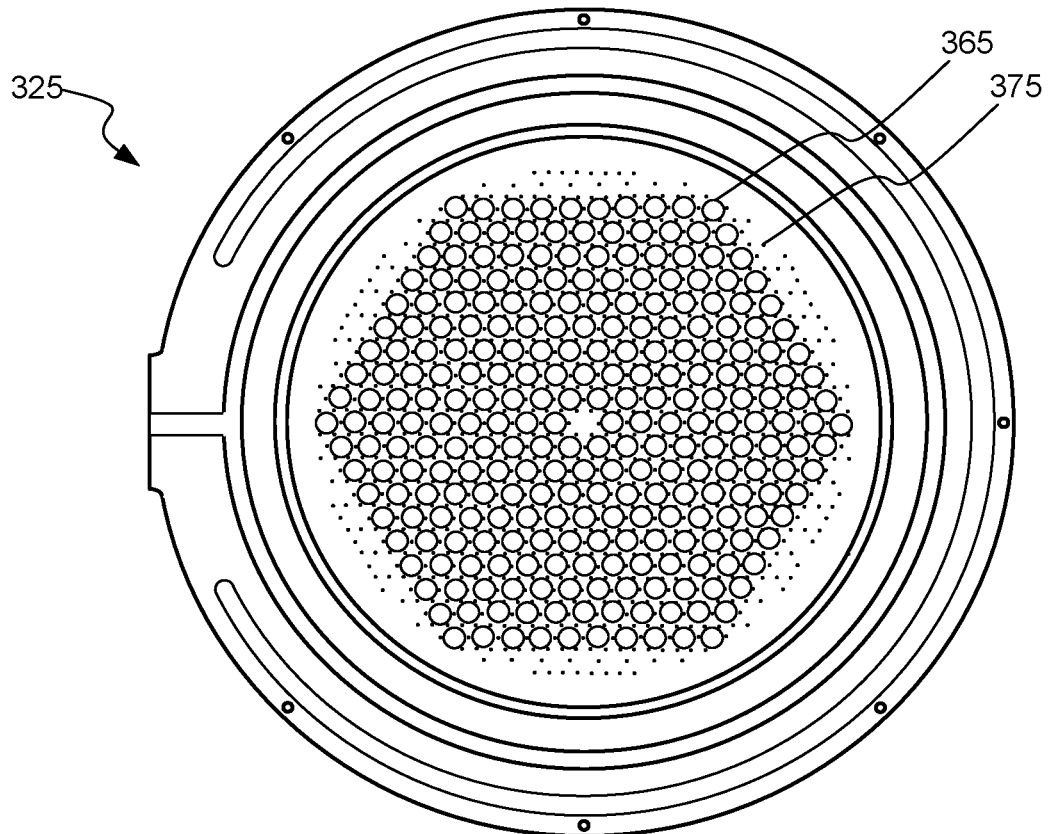
FIG. 3 shows a bottom plan view of an exemplary showerhead according to embodiments of the present technology.

The gas distribution assemblies such as showerhead 225 for use in the processing chamber section 201 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
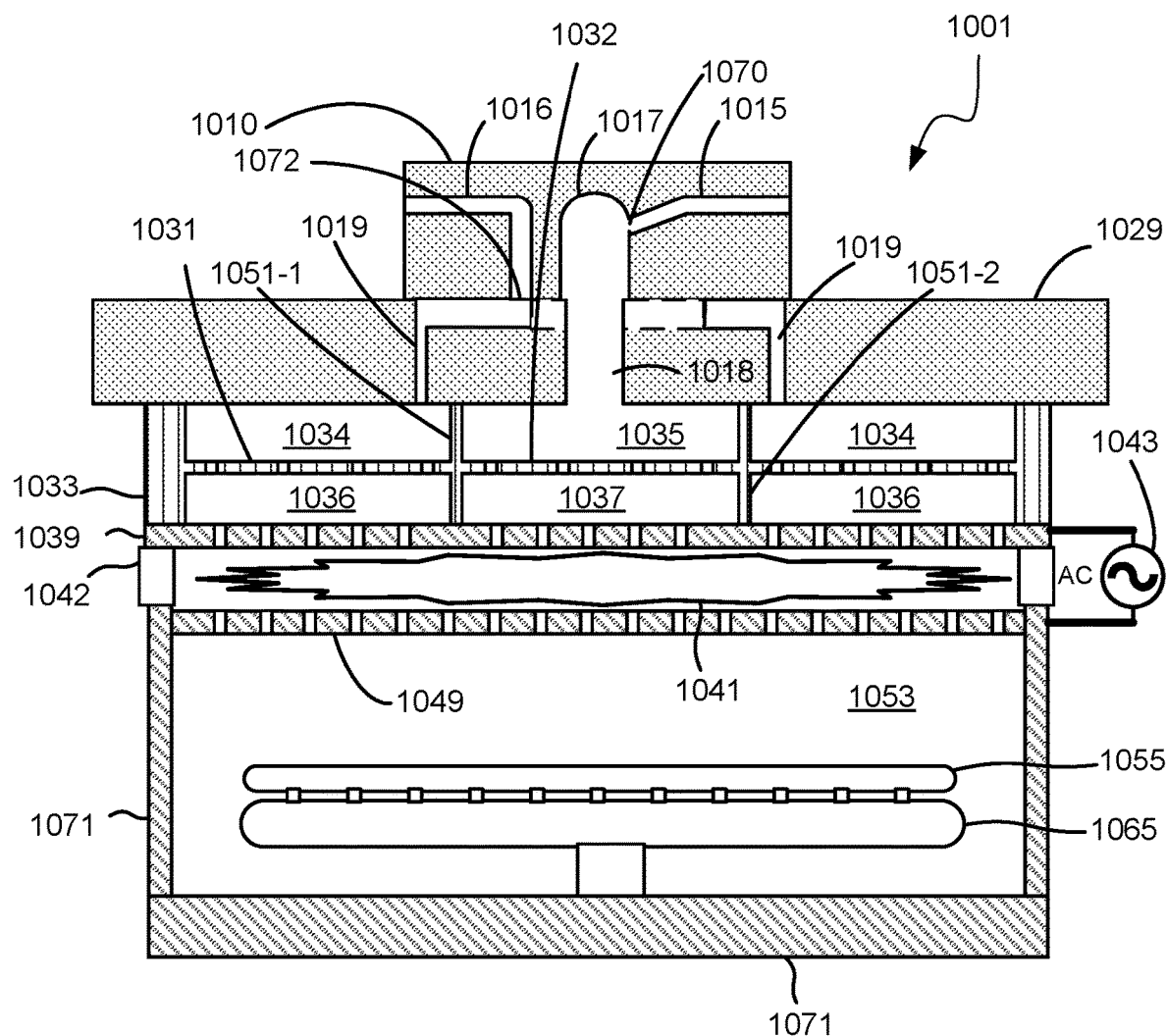
FIG. 4 shows a schematic partial cross-sectional view of an exemplary substrate processing system according to embodiments of the present technology.

FIG. 4 shows a schematic partial cross-sectional view of an exemplary substrate processing system according to embodiments of the present technology. A substrate processing chamber 1001 includes a zonal distribution manifold 1010 having a first manifold channel 1015 having an outlet 1070 and a second manifold channel 1016 having an outlet 1072. A first gas may flow through the first manifold channel 1015 and a second gas may flow through the second manifold channel 1016. The first manifold channel 1015 and the second manifold channel 1016 are separated such that the first gas and the second gas are prevented from mixing together within the zonal distribution manifold 1010 in embodiments. The first gas may expand from a more restrictive first manifold channel 1015 into a less restrictive inner zone expansion region 1017.

The substrate processing chamber 1001 may further include a zonal distribution plate 1029 which may be affixed to the zonal distribution manifold 1010. The zonal distribution plate 1029 also has two separate flow channels for preventing any mixing between the first gas and the second gas within the zonal distribution plate 1029. The zonal distribution plate 1029 has an inner zone channel 1018 configured to receive the first gas from inner zone expansion region 1017. The zonal distribution plate 1029 further includes an outer zone channel 1019 configured to receive the second gas from the second manifold channel 1016. Seals (e.g. o-rings) may be included to maintain separation between the first gas and the second gas once the zonal distribution plate 1029 and the zonal distribution manifold are affixed to one another during assembly (as shown).

The substrate processing chamber 1001 may further include a zonal blocker plate 1033 which may be affixed to the zonal distribution plate 1029 according to embodiments. The zonal blocker plate 1033 has a top inner recess 1035 configured to receive the first gas from the inner zone channel 1018 and a top outer recess 1034 configured to receive the second gas from the outer zone channel 1019. The zonal blocker plate 1033 further includes a bottom inner recess 1037 fluidly coupled to the top inner recess 1035 through an inner showerhead portion 1032. The zonal blocker plate 1033 may further include a bottom outer recess 1036 fluidly coupled to the top outer recess 1034 through an outer showerhead portion 1031. The substrate processing chamber 1001 may further include a faceplate 1039 affixed to the zonal blocker plate 1033 having through-holes configured to pass the first gas and the second gas into a plasma region. The top inner recess 1035 is laterally sealed from the top outer recess 1034 by a dividing wall 1051-1 which seals against the zonal distribution plate 1029 (e.g. using an o-ring). The bottom inner recess 1037 is laterally sealed from the bottom outer recess 1036 by a dividing wall 1051-2 which seals against the faceplate 1039 (e.g. using an o-ring). In this way, the first gas and the second gas do not encounter one another until entering the plasma region 1041. According to embodiments, the zonal distribution manifold 1010, the zonal distribution plate 1029 and the zonal blocker plate 1033 may be configured such that the first gas and the second gas do not mix until entering the plasma region 1041.

Plasma power is applied between the faceplate 1039 and a showerhead 1049 by an RF plasma power supply 1043. The plasma is formed in the plasma region 1041 from a combination of the first gas and the second gas. The technical aspects of the hardware just described enable an adjustment of the ratio of the first gas to the second gas across the lateral dimensions of the plasma region 1041. An electrically-insulating insert 1042 may be disposed between the faceplate 1039 and the showerhead 1049 to allow application of RF power from the RF plasma power supply 1043 to the faceplate 1039 relative to the showerhead 1049. Below the showerhead 1049, and within the substrate processing region walls 1071 may be disposed a substrate 1055 supported by a substrate support pedestal 1065.

The showerhead 1049 may be held at ground while the faceplate 1039 is at RF voltage. In another configuration the faceplate 1039 may be grounded while the showerhead 1049 is held at RF voltage to produce a plasma with RF power. Generally speaking, the anode is held at ground while the cathode is at RF voltage. In embodiments, the anode is the faceplate 1039 (or the showerhead 1049) and the cathode is the showerhead 1049 (or the faceplate 1039), respectively. A substrate processing region may be disposed on the opposite side of the showerhead 1049 from the plasma region and border the showerhead 1049. The configuration just described is a remote plasma since the plasma is not inside the substrate processing region.

According to embodiments, the methods and hardware described herein may also be used to improve the uniformity of a local plasma and or a local plasma process. The RF plasma power may be applied from the RF plasma power supply 1043 to the faceplate 1039 relative to the substrate support pedestal 1065 or to the substrate support pedestal 1065 relative to the faceplate. No showerhead 1049 is present, in embodiments, when forming a local plasma. In the local plasma configuration, the anode is the faceplate 1039 (or the substrate support pedestal 1065) and the cathode is the substrate support pedestal 1065 (or the faceplate 1039), respectively. The substrate processing region is disposed between the anode and the cathode and the substrate processing region abuts both the anode and the cathode.

The zonal distribution plate and the zonal blocker plate may be circular and may be shaped like disks according to embodiments. The zonal distribution plate and the zonal blocker plate may be coaxial in embodiments.

Figure 5A:
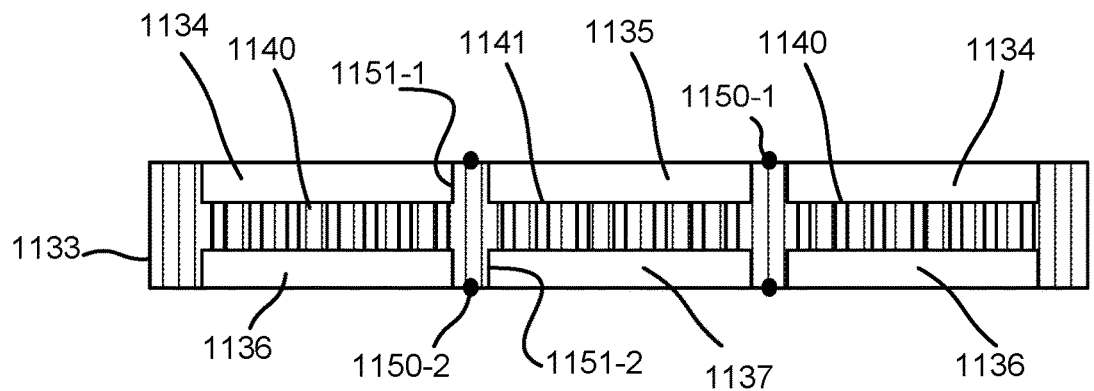
FIG. 5A shows a schematic partial cross-sectional view of an exemplary blocker plate according to embodiments of the present technology.
Figure 5B:
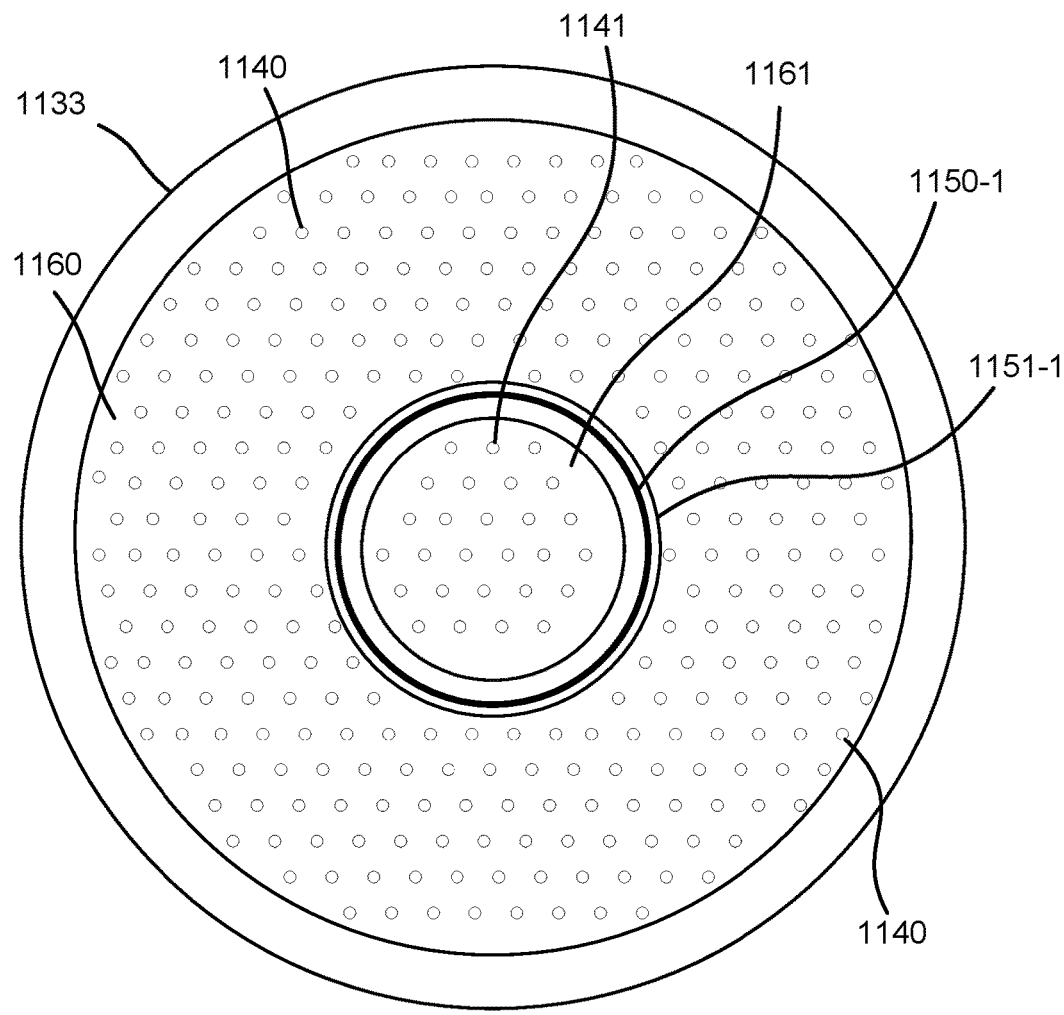
FIG. 5B shows a top view of an exemplary zonal blocker plate according to embodiments of the present technology.
Figure 5C:
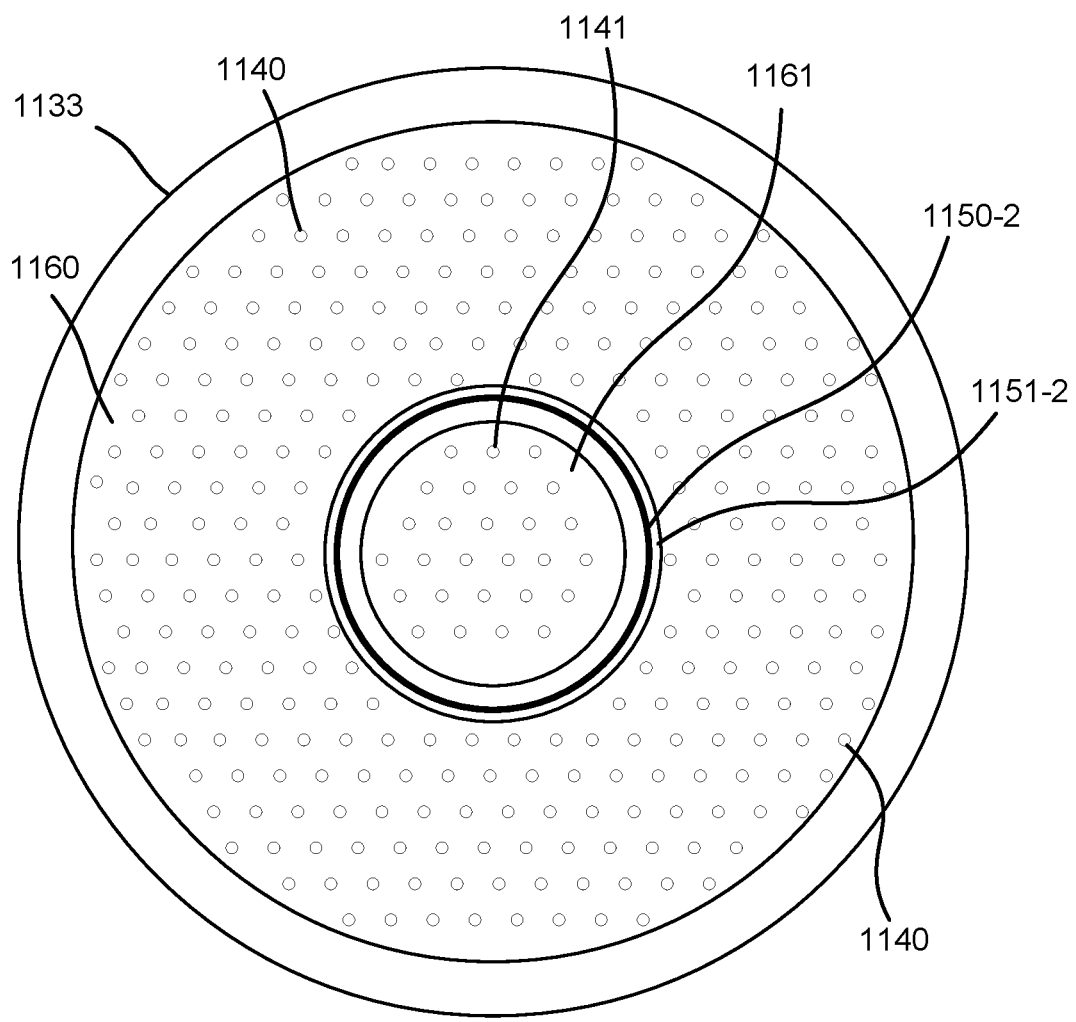
FIG. 5C shows a bottom view of an exemplary zonal blocker plate according to embodiments of the present technology.

FIG. 5A shows a schematic partial cross-sectional view of an exemplary blocker plate according to embodiments of the present technology. FIG. 5B shows a top view of an exemplary zonal blocker plate according to embodiments of the present technology. FIG. 5C shows a bottom view of an exemplary zonal blocker plate according to embodiments of the present technology. A zonal blocker plate 1133 is depicted before being affixed to a zonal distribution plate or a faceplate. The zonal blocker plate 1133 has a top outer recess 1134 and a top inner recess 1135 which are separated by a dividing wall 1151-1. The zonal blocker plate 1133 further has a bottom outer recess 1136 and a bottom inner recess 1137 separated by a dividing wall 1151-2. An outer showerhead 1160 is disposed between the top outer recess 1134 and the bottom outer recess 1136 and is configured to pass the second gas through outer through-holes 1140. An inner showerhead 1161 is disposed between the top inner recess 1135 and the bottom inner recess 1137 and is configured to pass the first gas through inner through-holes 1141.

The inner showerhead 1161 may be circular and may be centered about the center of the zonal blocker plate 1133 according to embodiments. The outer showerhead 1160 may be annular as shown and may be centered about the center of the inner showerhead 1161 and/or the center of the zonal blocker plate 1133 in embodiments. The ratio of the area of the outer showerhead 1160 relative to the area of the inner showerhead 1161 may be selected to benefit the plasma or process uniformity, according to embodiments, and the sizes and density of through-holes may remain constant across both the outer and inner showerheads. The density of through-holes may be different from one another for the outer showerhead and the inner showerhead in embodiments. The sizes of the through-holes in the inner showerhead may differ from the through-holes in the outer showerhead according to embodiments.

The first gas may be flowed through the inner showerhead and the second gas may be flowed through the outer showerhead, in embodiments, and the inner showerhead may be between 25% and 75%, between 30% and 70%, between 35% and 65% or between 40% and 60% of the area of the outer showerhead. A density of the through-holes may be the same for the inner showerhead and the outer showerhead. The sizes of the through-holes of the inner-showerhead may also be the same of the sizes of the through-holes of the outer showerhead according to embodiments. The areas of the dividing wall and the outer flange are not included in the area calculation. A top o-ring 1150-1 may optionally be used to improve the seal between top outer recess 1134 and top inner recess 1135 in embodiments. Similarly, a bottom o-ring 1150-2 may optionally be used to improve the seal between bottom outer recess 1136 and bottom inner recess 1137, in embodiments, upon assembly. The sizes of the inner showerhead and outer showerhead may be selected to facilitate the use of a standard o-ring size. The outer diameter of the outer showerhead may be about twelve inches or more for processing a twelve inch circular substrate or wafer. According to embodiments, the inner showerhead may have a diameter between four inches and ten inches, between five inches and nine inches, or between six inches and eight inches. The outer showerhead may have an inner diameter greater than four inches, greater than five inches, greater than six inches or greater than seven inches in embodiments. The outer showerhead may have an outer diameter less than fourteen inches or less than thirteen inches according to embodiments. The total flow of the first gas may be roughly similar to the flow rate of the second gas for an area of the inner showerhead near the area of the outer showerhead (if the densities and geometries of the through-holes are the same). Beginning with such a design may simplify the optimization of flow rate ratios of the first gas to the second gas for some processes. Other types of processes will be introduced in a subsequent discussion herein.

The inner showerhead may have through-holes with diameters between 0.1 mm and 3 mm, between 0.3 mm and 2 mm, or between 0.5 mm and 1.5 mm according to embodiments. Diameters given herein describe the narrowest diameter in cases where the diameter varies along the through-hole. The outer showerhead may have through-holes with diameters between 0.1 mm and 3 mm, between 0.3 mm and 2 mm, or between 0.5 mm and 1.5 mm according to embodiments. The inner showerhead may have between 30 and 2,000 through-holes, between 50 and 1,000 through-holes or between 100 and 500 through-holes in embodiments. The outer showerhead may have between 30 and 2,000 through-holes, between 50 and 1,000 through-holes or between 100 and 500 through-holes according to embodiments. A range of densities of through-holes in either the inner showerhead or the outer showerhead may be calculated using the ranges of the total number of through-holes in combination with the ranges of dimensions of the corresponding showerhead. The inner showerhead may have an open area between 0.1% and 50%, between 0.2% and 30%, between 0.5% and 15%, or between 1% and 10% of the total area in embodiments. The outer showerhead may have an open area between 0.1% and 50%, between 0.2% and 30%, between 0.5% and 15%, or between 1% and 10% of the total area according to embodiments.

Some processes have been found to benefit from a relatively small inner showerhead surrounded by a relatively thicker annular outer showerhead. Exemplary processes will be presented herein. The first gas (the center gas) may help form a stable plasma whose principal component is the second gas. The first gas may be flowed through the inner showerhead and the second gas may be flowed through the outer showerhead, in embodiments, and the inner showerhead may be below 25%, below 20%, below 15%, below 10%, below 5% or below 4% of the area of the outer showerhead. The diameter of the inner showerhead may be less than 10%, less than 9%, less than 8%, less than 7%, less than 6% or less than 5% of the diameter of the outer showerhead according to embodiments. According to embodiments, the first gas may simply flow through a single through hole at the center of the zonal blocker plate. The dimensions of the through-holes in the outer showerhead may be as recited previously. If present, the inner showerhead may possess through-holes having the previously recited dimensions in embodiments. Alternatively, the single through-hole at the center may have a diameter between 0.1 mm and 3 mm, between 0.3 mm and 2 mm, between 0.5 mm and 1.5 mm, or less than 3 mm according to embodiments. The single through-hole at the center may align directly above a central hole in the faceplate disposed beneath the zonal blocker plate in embodiments.

The thickness of the outer top recess may be between 1 mm and 5 mm or between 2 mm and 4 mm according to embodiments. The thickness of the outer top recess may be about the same as the inner top recess. The inner top recess may have a thickness between 1 mm and 5 mm or between 2 mm and 4 mm in embodiments. The thickness of the outer bottom recess may be between 1 mm and 5 mm or between 2 mm and 4 mm according to embodiments. The thickness of the outer bottom recess may be about the same as the inner bottom recess. The inner bottom recess may have a thickness between 1 mm and 5 mm or between 2 mm and 4 mm in embodiments. The thickness of the outer showerhead may be between 1 mm and 5 mm or between 2 mm and 4 mm according to embodiments. The thickness of the outer showerhead may be about the same as the inner showerhead. The inner showerhead may have a thickness between 1 mm and 5 mm or between 2 mm and 4 mm in embodiments.

Figure 6A:
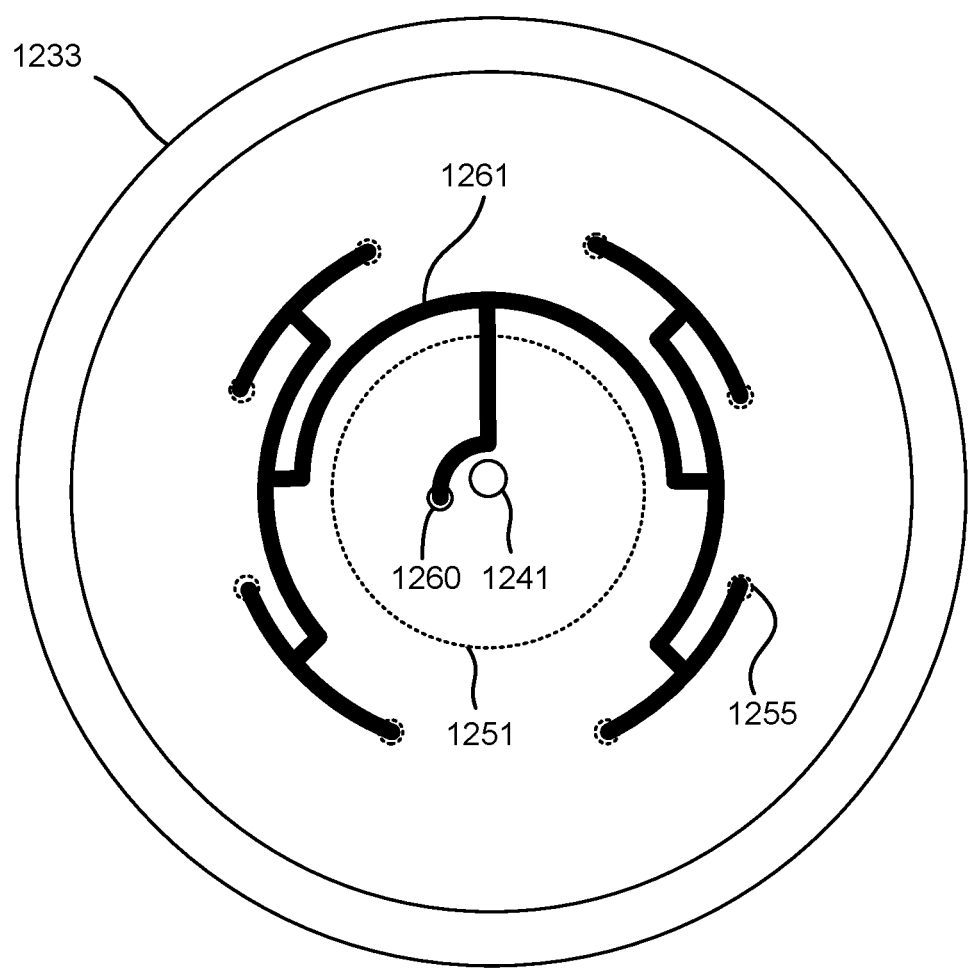
FIG. 6A shows a top view of an exemplary zonal distribution plate according to embodiments of the present technology.
Figure 6B:
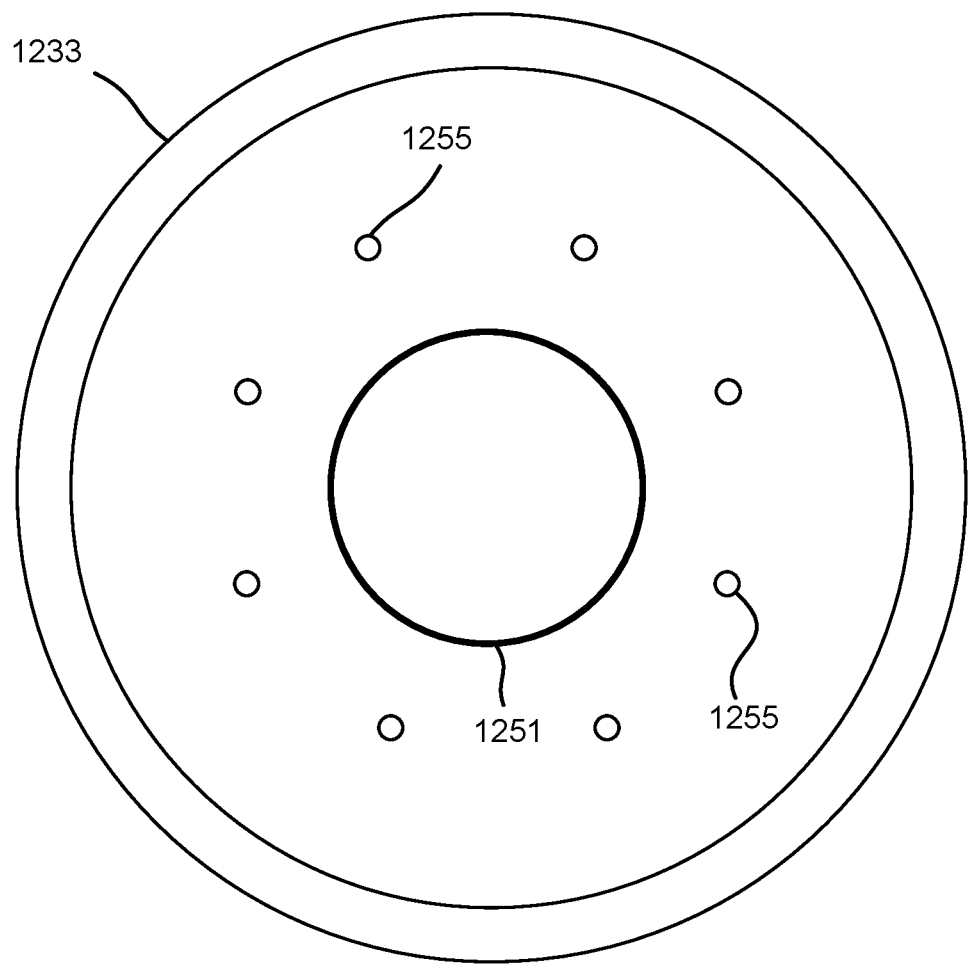
FIG. 6B shows a bottom view of an exemplary zonal distribution plate according to embodiments of the present technology.

FIG. 6A shows a top view of an exemplary zonal distribution plate according to embodiments of the present technology. FIG. 6B shows a bottom view of an exemplary zonal distribution plate according to embodiments of the present technology. The zonal distribution plate 1233 has a center through-hole 1241 configured to pass the first gas into the top inner recess of a zonal blocker plate. The zonal distribution plate 1233 has a top groove 1261 formed into the top surface configured to form a channel for passing the second gas into the top outer recess of the zonal blocker plate. Upon assembly, the bottom surface of a zonal distribution manifold in combination with the top groove 1261 may form the second gas channel by pressing up against the top of the zonal distribution plate 1233. Upon assembly, top groove 1261 is configured to conduct the second gas from a starting point to a plurality of bottom holes 1255 which open through the bottom of the zonal distribution plate 1233 and into the top outer recess of the zonal blocker plate. The top groove 1261 may be configured to receive the second gas from the second manifold channel at a starting point (determined by the terminus of the second manifold channel of a zonal distribution manifold). According to embodiments, the path length from the starting point, along the groove to each of the plurality of bottom holes may be the same for each of the plurality of bottom holes. The plurality of bottom holes may include at least two bottom holes, at least four bottom holes, at least six bottom holes, at least eight bottom holes, or at least ten bottom holes according to embodiments. The plurality of bottom holes may include an even number of bottom holes. The plurality of bottom holes may be arranged around a circle centered at the center of the zonal distribution plate 1233. The plurality of bottom holes may be arranged evenly (at equal spacings) along the circle in embodiments.

The center through-hole may have a diameter between 0.1 mm and 30 mm, between 0.5 mm and 20 mm, or between 1 mm and 5 mm according to embodiments. Each of the plurality of bottom holes may have the same dimensions and the diameter may be between 0.1 mm and 10 mm, between 0.3 mm and 5 mm, or less than 3 mm in embodiments. The top groove 1261 may have a width of between 1 mm and 10 mm, between 2 mm and 8 mm, or between 3 mm and 7 mm according to embodiments. A variety of architectures for the top groove 1261 may achieve the same path length objective, however, one option is depicted in FIG. 6A. The top groove 1261 may begin at a starting point 1260 at a first radius from the center through-hole 1241. The top groove 1261 may have a circumferential portion at the first radius followed by a radial portion out to a second radius from the center through-hole 1241. The top groove 1261 may have a one hundred and eighty degree circumferential portion bisecting the radial portion at the second radius. Two radial portions extend from the ends of the one hundred and eighty degree circumferential portion out to a third radius. Each of the two radial portions of the top groove 1261 may bisect each of two ninety degree circumferential portions. Each terminus of the two ninety degree circumferential portions are connected to four additional radial portions which begin at the third radius and extend out to a fourth radius. Lastly, four forty-five degree circumferential portions are bisected by the four additional radial portions at the fourth radius. Each of the four forty-five degree circumferential portions may terminate at one of the eight bottom holes of the zonal distribution plate 1233. Each of the recited circumferential portions may be circumferential about the center of the zonal distribution plate 1233. According to embodiments, the fourth radius may be greater than the third radius, the third radius may be greater than the second radius, and the second radius may be greater than the first radius. The recited architecture represents one way to deliver the first gas to the top inner recess and the second gas to the top outer recess. An o-ring 1251 may be included on the bottom of the zonal distribution plate 1233 to seal the top inner recess from the top outer recess on a zonal blocker plate.

Figure 7:
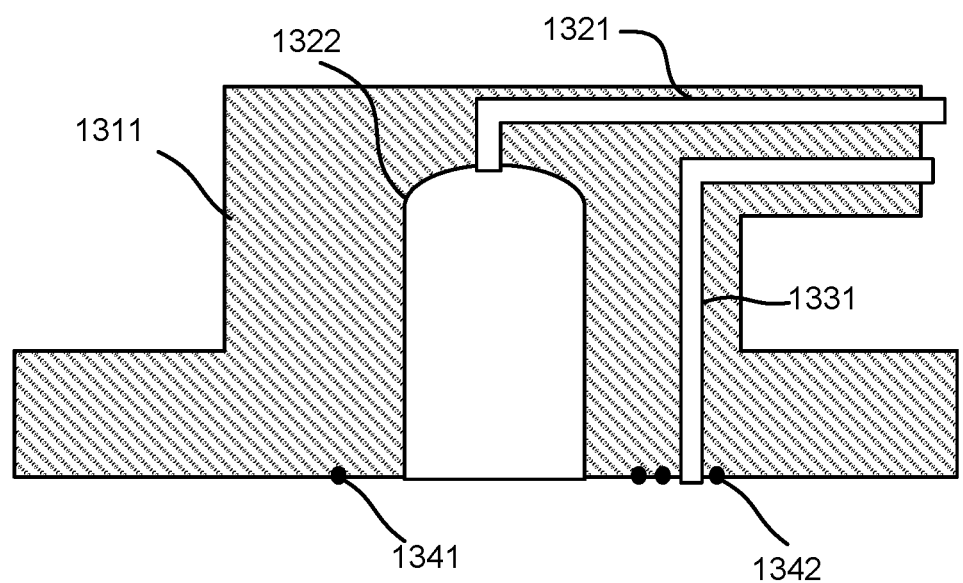
FIG. 7 shows a schematic partial cross-sectional view of a zonal distribution manifold according to embodiments of the present technology.

FIG. 7 shows a schematic partial cross-sectional view of a zonal distribution manifold 1311 according to embodiments of the present technology. The zonal distribution manifold has a first manifold channel 1321 and a second manifold channel 1331. The first manifold channel 1321 is fluidly coupled with an expansion region 1322 to improve the internal mixing of a first gas prior to entering the top inner recess through the center through-hole of a zonal distribution plate. An inner zone channel o-ring 1341 may be included to further separate the first gas from mixing with the second gas prematurely. The second manifold channel 1331 is fluidly coupled to pass the second gas through the top groove of a zonal distribution plate and then through a plurality of bottom holes into the top outer recess of a zonal blocker plate. An outer zone channel o-ring 1342 may be included to maintain separation between the first gas and the second gas in embodiments. The first manifold channel may have a circular cross-section and a diameter greater than 2 mm, greater than 5 mm, or greater than 10 mm according to embodiments. The second manifold channel may have a circular cross-section and a diameter greater than 2 mm, greater than 5 mm, or greater than 10 mm in embodiments. The expansion region may have a circular cross-section and a diameter greater than 5 mm, greater than 10 mm, or greater than 15 mm according to embodiments.

Figure 8A:
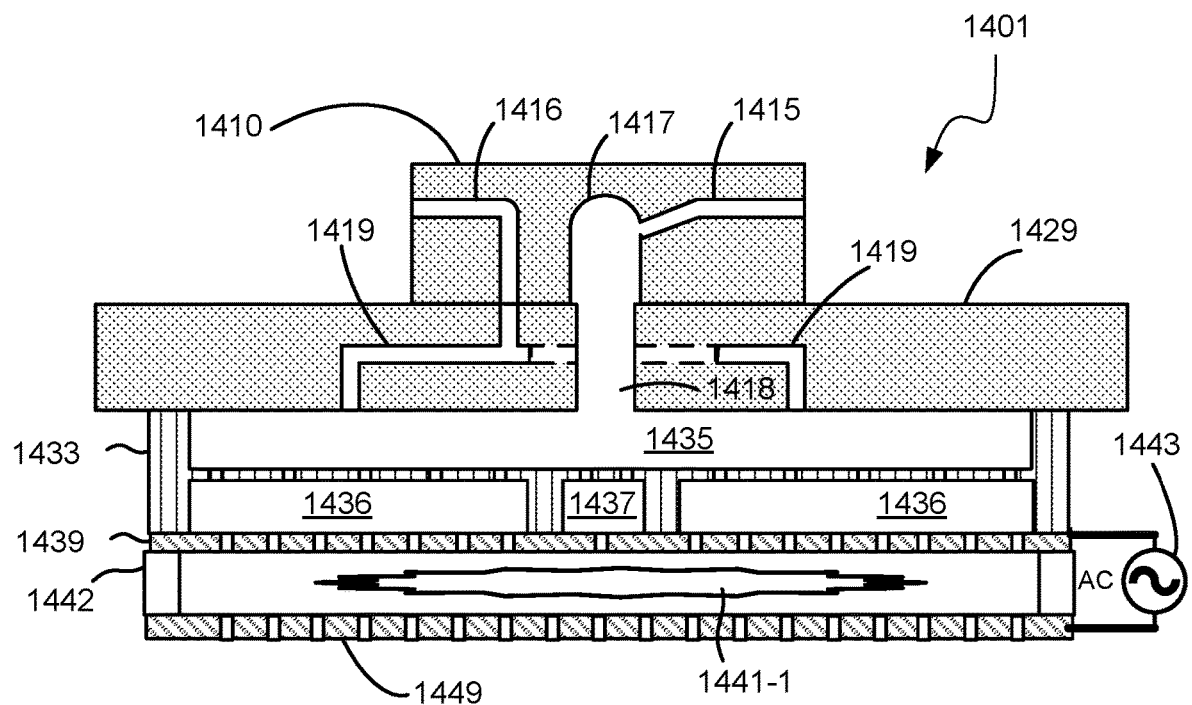
FIG. 8A shows a schematic partial cross-sectional view of an exemplary substrate processing system according to embodiments of the present technology.
Figure 8B:
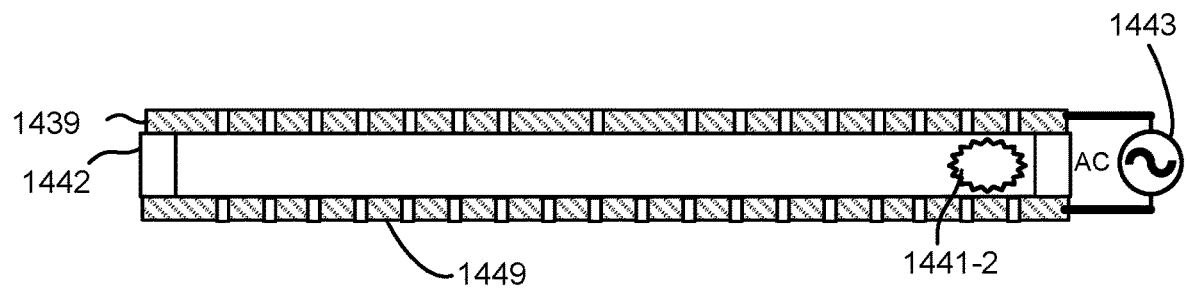
FIG. 8B shows a schematic partial cross-sectional view of an exemplary substrate processing system according to embodiments of the present technology.
Figure 9A:
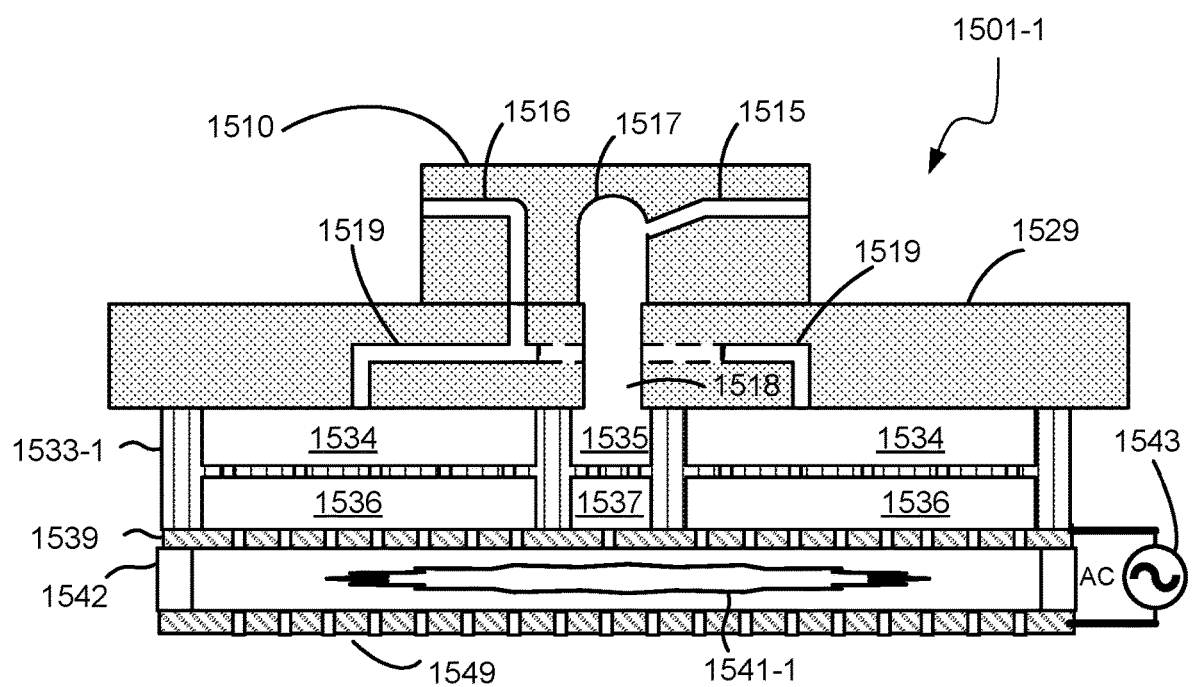
FIG. 9A shows a schematic partial cross-sectional view of an exemplary substrate processing system according to embodiments of the present technology.
Figure 9B:
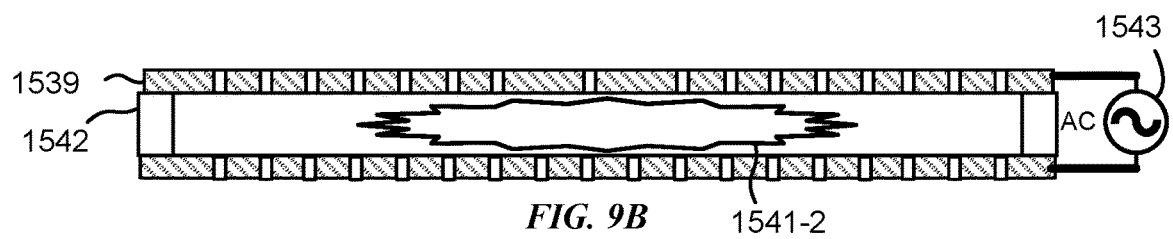
FIG. 9B shows a schematic partial cross-sectional view of an exemplary substrate processing system according to embodiments of the present technology.
Figure 9C:
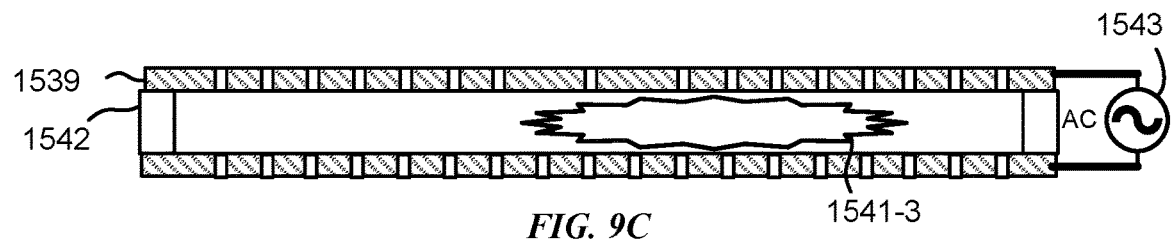
FIG. 9C shows a schematic partial cross-sectional view of an exemplary substrate processing system according to embodiments of the present technology.
Figure 9D:
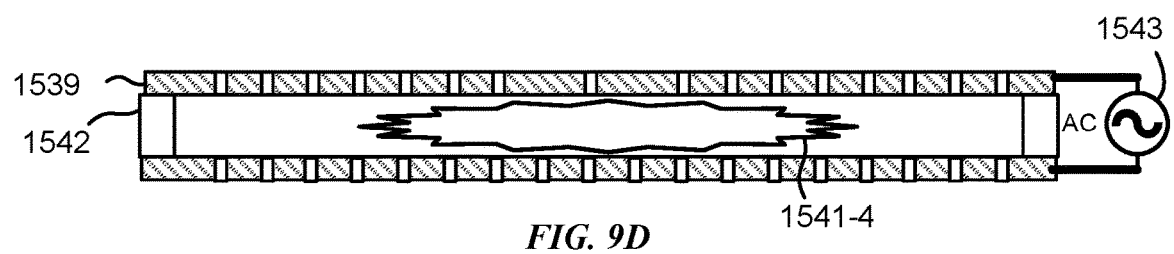
FIG. 9D shows a schematic partial cross-sectional view of an exemplary substrate processing system according to embodiments of the present technology.
Figure 9E:
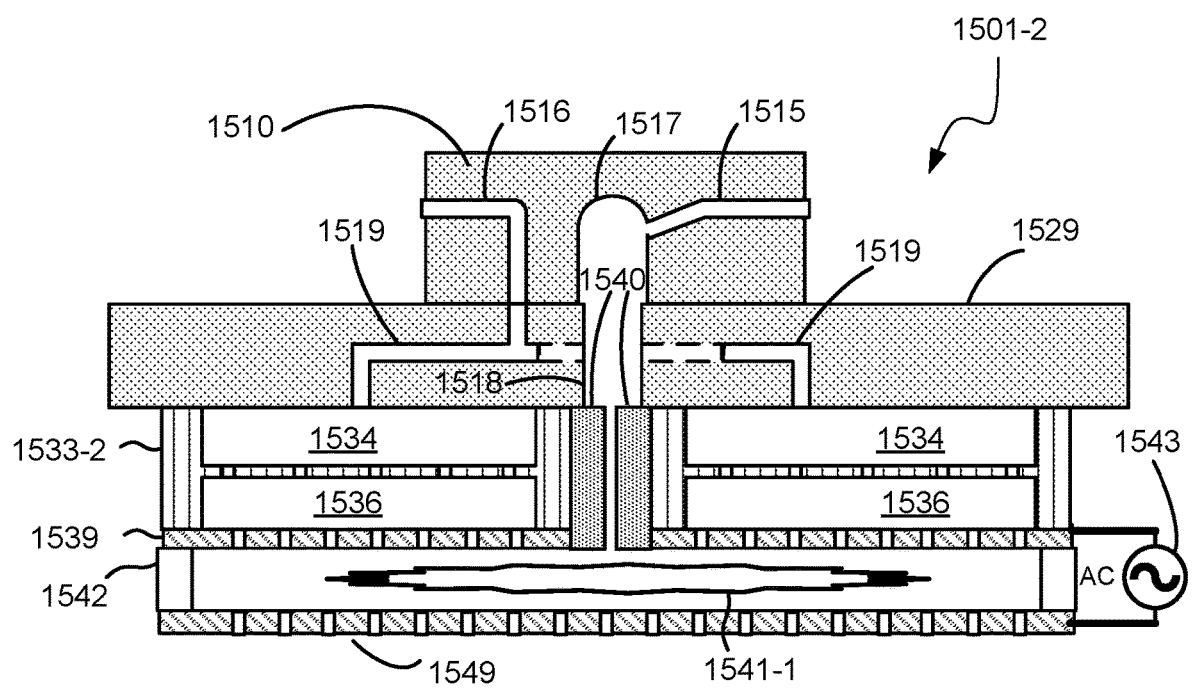
FIG. 9E shows a schematic partial cross-sectional view of an exemplary substrate processing system according to embodiments of the present technology.

FIGS. 8A and 8B show a schematic partial cross-sectional view of an exemplary substrate processing system according to embodiments of the present technology. The hardware shown is described to show process problems which may be overcome by aspects of the technology presented herein. A fluorine-containing plasma is formed in the substrate processing system and shows instability which is addressed by the methods and systems described herein. A substrate processing chamber 1401 includes a zonal distribution manifold 1410 having a first manifold channel 1415 and a second manifold channel 1416. A hydrogen-containing precursor occasionally flows through the first manifold channel 1415 and a fluorine-containing precursor flows through the second manifold channel 1416. The hydrogen-containing precursor expands from the first manifold channel 1415 into the expansion region 1417. The substrate processing chamber 1401 further includes a zonal distribution plate 1429 affixed to the zonal distribution manifold 1410. The hydrogen-containing precursor flows from the expansion region 1417 into the inner zone channel 1418. The fluorine-containing precursor flows from the second manifold channel 1416 into the outer zone channel 1419. The two channels are separate and no mixing occurs in the hardware depicted until the hydrogen-containing precursor and the fluorine-containing precursor exit the zonal distribution plate 1429.

The substrate processing chamber 1401 further include a zonal blocker plate 1433 affixed to the zonal distribution plate 1429 according to embodiments. The zonal blocker plate 1433 has a top recess 1435 configured to receive the hydrogen-containing precursor from the inner zone channel 1418. In contrast to the hardware of FIG. 4, the top recess 1435 is also configured to receive the fluorine-containing precursor from the outer zone channel 1419. In this case there are no dividing walls so the two precursors can mix. The zonal blocker plate 1433 includes a bottom inner recess 1437 fluidly coupled to the top recess 1435 through an inner showerhead portion. The zonal blocker plate 1433 further includes a bottom outer recess 1436 fluidly coupled to the top recess 1435 through an outer showerhead portion. The substrate processing chamber 1401 further includes a faceplate 1439 affixed to the zonal blocker plate 1433 having through-holes configured to pass the hydrogen-containing precursor and/or the fluorine-containing precursor into a plasma region to form plasma 1441-1. Plasma power is applied between the faceplate 1439 and a showerhead 1449 by an RF plasma power supply 1443. An electrically-insulating insert 1442 may be disposed between the faceplate 1439 and the showerhead 1449 to allow application of RF power from the RF plasma power supply 1443 to the faceplate 1439 relative to the showerhead 1449. Below the showerhead 1449, and within the substrate processing region walls 1471 may be disposed a substrate 1455 supported by a substrate support pedestal 1465.

A plasma 1441-1 is initially formed in the plasma region from the fluorine-containing precursor without the hydrogen-containing precursor. Though the fluorine plasma 1441-1 may begin centered within the plasma region, instabilities have been observed which may cause the initial fluorine plasma 1441-1 to collapse to an off-center fluorine plasma 1441-2. The off-center fluorine plasma 1441-2 may reside on the edge of the plasma region and occupy less than half or less than a quarter of a circular plasma region. Off-center plasmas may lead to unacceptable process variations. Cleaning plasmas and substrate processing plasmas are very thin and difficult to maintain especially when a preponderance of the gases flowed into the plasma contain a highly electronegative atom such as fluorine. Positively-charged fluorine ions are very hard to create so the electron concentration stays low even during the plasma. These properties may lead to the observed off-center plasma.

Two technologies are presented herein which may be used separately or in combination to provide a solution to the plasma instability. The hardware described herein may even be used (along with the processes described herein) to avoid an off-center "collapsed" plasma which has been observed with fluorine plasmas. Thus, the hardware and methods described herein may be used to form a centered and concentric plasma which benefits plasma control efforts and makes the process more uniform.

FIGS. 9A-9E show a schematic partial cross-sectional view of an exemplary substrate processing system according to embodiments of the present technology. The hardware shown remedies, in part, the plasma instabilities shown in FIG. 8B. A substrate processing chamber 1501-1 includes a zonal distribution manifold 1510 having a first manifold channel 1515 and a second manifold channel 1516. A hydrogen-containing precursor flows through the first manifold channel 1515 and a fluorine-containing precursor flows through the second manifold channel 1516. The hydrogen-containing precursor expands from the first manifold channel 1515 into the expansion region 1517. The substrate processing chamber 1501-1 further include a zonal distribution plate 1529 affixed to the zonal distribution manifold 1510. The hydrogen-containing precursor flows from the expansion region 1517 into the inner zone channel 1518. The fluorine-containing precursor flows from the second manifold channel 1516 into the outer zone channel 1519. The two channels are separate and no mixing occurs in the hardware depicted until the hydrogen-containing precursor and the fluorine-containing precursor enter the plasma region downstream. In embodiments, the outer zone channel 1519 may include a groove formed in the top of the zonal distribution plate 1529 or may include channels formed inside the zonal distribution plate 1529, in embodiments, as shown.

The substrate processing chamber 1501-1 further include a zonal blocker plate 1533-1 affixed to the zonal distribution plate 1529 according to embodiments. The zonal blocker plate 1533-1 has a top inner recess 1535 configured to receive the hydrogen-containing precursor from the inner zone channel 1518. The zonal blocker plate 1533-1 has a top outer recess 1534 configured to receive the fluorine-containing precursor from the outer zone channel 1519. Dividing walls prevent the hydrogen-containing precursor from mixing with the fluorine-containing precursor. The zonal blocker plate 1533-1 includes a bottom inner recess 1537 fluidly coupled to the top inner recess 1535 through an inner showerhead portion. The zonal blocker plate 1533-1 further includes a bottom outer recess 1536 fluidly coupled to the top outer recess 1534 through an outer showerhead portion. The substrate processing chamber 1501-1 further includes a faceplate 1539 affixed to the zonal blocker plate 1533-1 having through-holes configured to pass the hydrogen-containing precursor and/or the fluorine-containing precursor into a plasma region to form plasma 1541-1. Plasma power is applied between the faceplate 1539 and a showerhead 1549 by an RF plasma power supply 1543. An electrically-insulating insert 1542 may be disposed between the faceplate 1539 and the showerhead 1549 to allow application of RF power from the RF plasma power supply 1543 to the faceplate 1539 relative to the showerhead 1549.

A plasma 1541-1 may be initially formed in the plasma region from the hydrogen-containing precursor without the fluorine-containing precursor according to embodiments. The fluorine-containing precursor is then flowed into the plasma region once the hydrogen plasma has begun. The hydrogen in the plasma more easily lose electrons and help initiate a healthy plasma 1541-2 of the fluorine-containing precursor. The hydrogen-containing precursor flow into the plasma region may be shut down or shut off once the healthy plasma 1541-2 has begun. Fluorine plasmas formed in this way have been observed to be more intense and desirably located at the center of the plasma region. The stability of the fluorine plasma 1541-2 was further tested by beginning a separate flow of the fluorine-containing precursor to the center of the fluorine plasma 1541-2 (e.g. using the first manifold channel 1515 instead of the second manifold channel 1516). The fluorine plasma 1541-2 moves to the side to form a skewed fluorine plasma 1541-3. However, the fluorine plasma 1541-4 returns to the center (and possesses the same high intensity) once the fluorine-containing precursor is shut down or shut off according to embodiments.

The hydrogen atoms in the plasma may be donating electrons more readily or freely to the plasma and the donated electrons initiate a more comprehensive ionization of the fluorine atoms in the plasma. Introducing the hydrogen atoms may be beneficially effected by flowing the hydrogen-containing precursor to the center of the plasma region using, for example, the first manifold channel. The introduction of the "fresh" fluorine-containing precursor (which are difficult to ionize) attempts to put out the plasma since there is no concurrent source of hydrogen at this stage. In response, the plasma pushes off to the side but the significant initial ionization persists despite the absence of the hydrogen and the presence of the new fluorine-containing precursor flow. The introduction of the additional fluorine-containing precursor flow was introduced to establish the stability and health of the fluorine plasma rather than to suggest a desirable process flow.

Additional embodiments may be used to produce the stable fluorine plasma 1541-2 and perhaps other processes. In embodiments, the zonal blocker plate 1533-2 may have a central through-hole formed in an inner channel insert 1540. The central through-hole may be configured to receive the first gas (e.g. a hydrogen-containing precursor) from the inner zone channel 1518. The zonal blocker plate 1533-2 may include a top outer recess 1534 configured to receive the second gas (e.g. a fluorine-containing precursor) from the outer zone channel 1519. The zonal blocker plate 1533-2 may further include a bottom outer recess 1536 fluidly coupled to the top outer recess 1534 through an outer showerhead portion. The zonal blocker plate 1533-2 may further include a faceplate 1539 affixed to the zonal blocker plate 1533-2 having through-holes configured to pass the second gas into a plasma region. The zonal blocker plate 1533-2 may have a central faceplate hole configured to receive the first gas from the central through-hole in the inner channel insert 1540 and pass the first gas into the plasma region to form a plasma 1541-1. The substrate processing chamber 1501-2 may be used to form the stable fluorine plasma 1541-2 by performing the hydrogen-containing precursor sequence (recited above). The hydrogen-containing precursor would flow through the inner channel insert 1540 (through a central through-hole) in this case.

Figure 10:
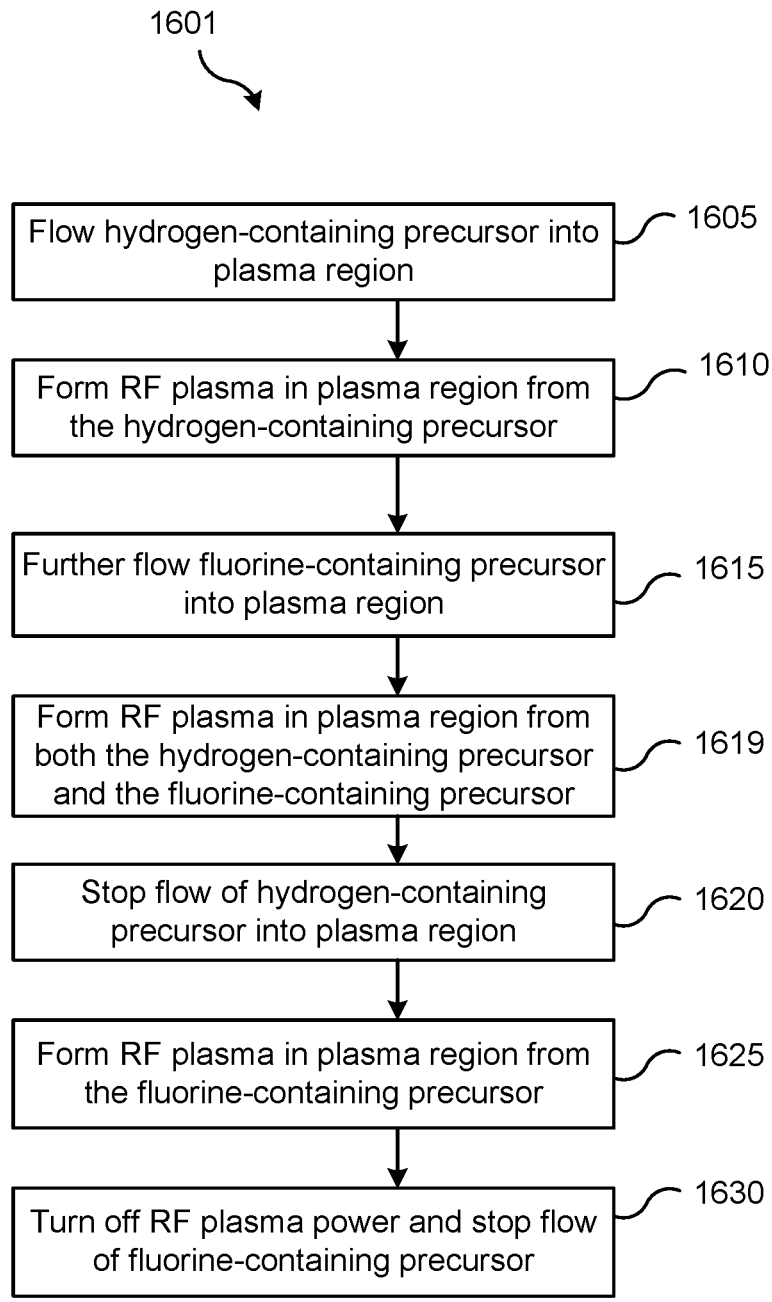
FIG. 10 shows a method of forming a plasma according to embodiments of the present technology.
Figure 11:
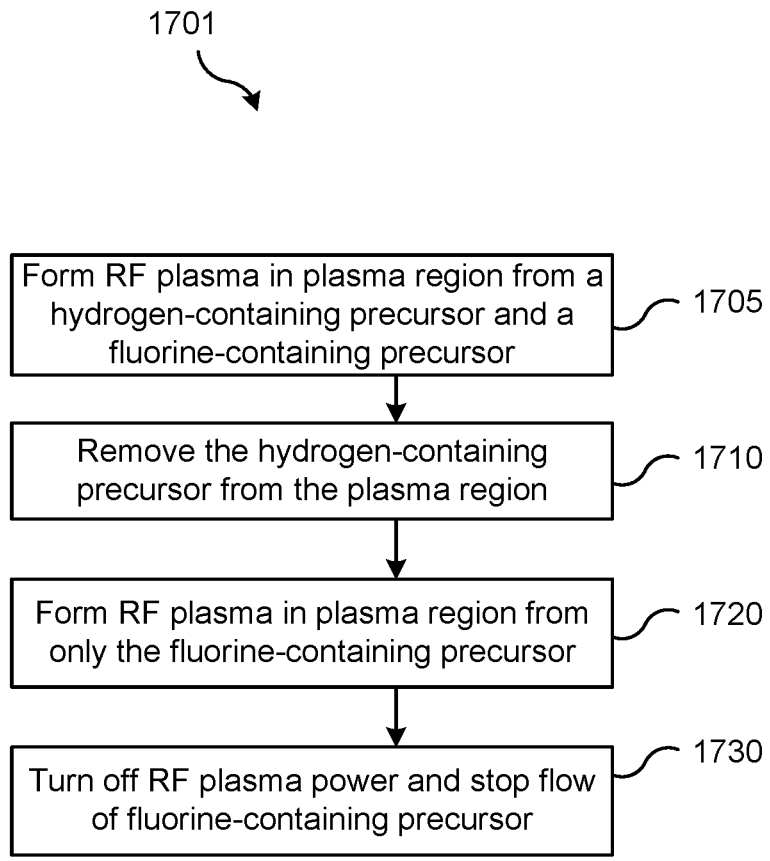
FIG. 11 shows a method of forming a plasma according to embodiments of the present technology.
Figure 12:
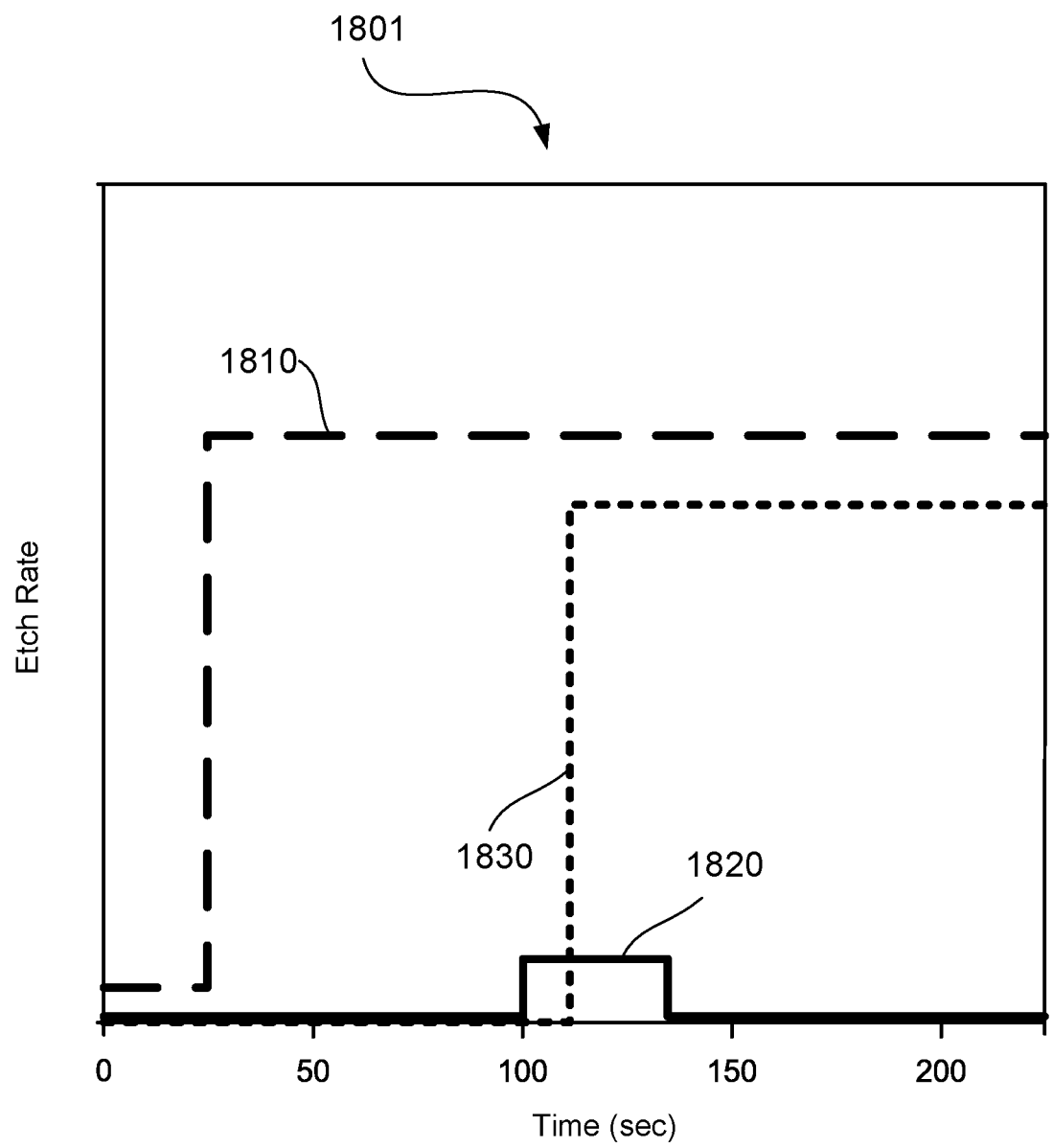
FIG. 12 shows a plot of exemplary plasma parameters during a process according to embodiments of the present technology.

FIGS. 10 and 11 show methods of forming a plasma according to embodiments of the present technology. FIG. 12 shows a plot of exemplary plasma parameters during a process according to embodiments of the present technology. A method 1601 of forming a plasma includes flowing a hydrogen-containing precursor into a plasma region in operation 1605. An RF plasma power is applied to the plasma region to form a plasma from the hydrogen-containing precursor in operation 1610. No fluorine is present in the plasma region according to embodiments. In embodiments, the fluorine concentration may be less than the hydrogen concentration (as measured in atomic concentration), less than 50%, less than 20%, less than 10% or less than 5% of the hydrogen-concentration. The hydrogen-containing precursor may be flowed into the plasma region before starting the RF power or the RF power may be applied first prior to flowing the hydrogen-containing precursor into the plasma region according to embodiments. In FIG. 12, the plot 1801 shows RF power 1810 applied prior to flowing the hydrogen-containing precursor 1820.

The method 1601 further includes flowing a fluorine-containing precursor into the plasma region in operation 1615. The flow of the fluorine-containing precursor is represented as 1830 in the plot 1801 shown in FIG. 12. The applied RF power then excites a mixture of the hydrogen-containing precursor and the fluorine-containing precursor, in operation 1619, to form a stronger plasma in the plasma region. The flow of the hydrogen-containing precursor into the plasma region may be stopped in operation 1620. The continued application of the RF power results in a fluorine-plasma in operation 1625. Though the hydrogen is no longer present, the fluorine plasma has been permanently altered, in embodiments, and may be more stable to various destabilizing forces which may unavoidably occur in a manufacturing environment. The RF plasma power is turned off, in operation 1630, and the flow of fluorine-containing precursor is halted.

In FIG. 11, An RF plasma is formed in the plasma region from a mixture of the hydrogen-containing precursor and the fluorine-containing precursor in operation 1705. The hydrogen-containing precursor is removed from the plasma region in operation 1710. An RF plasma is then formed in the plasma region from only the fluorine-containing precursor in operation 1720. The RF plasma power is turned off, in operation 1730, and the flow of fluorine-containing precursor is halted. According to embodiments, the RF plasma power may be turned off before or after the flow of the fluorine-containing precursor is stopped.

The hydrogen-containing precursor may be flowed into the plasma region for between 1 second and 30 seconds, between 2 seconds and 20 seconds or between 3 seconds and 15 seconds in embodiments.

In all embodiments described herein, the flow of the first gas (e.g. hydrogen) may be controlled by a first mass flow controller (MFC) and the flow of the second gas (e.g. fluorine) may be controlled by a second mass flow controller. The first mass flow controller and the second mass flow controller may be located outside the substrate processing chamber and upstream from the zonal distribution manifold. The flow of the exemplary hydrogen-containing precursor may be between 1 sccm and 200 sccm, between 5 sccm and 100 sccm or between 10 sccm and 50 sccm according to embodiments. The flow of the exemplary fluorine-containing precursor may be between 20 sccm and 5,000 sccm, between 50 sccm and 2,000 sccm or between 100 sccm and 1,000 sccm according to embodiments. The hydrogen-containing precursor may produce a strong and stable fluorine plasma at a significantly lower flow rate compared to the fluorine-containing precursor. A flow of helium was included as a carrier gas in the flow of each of the precursors. Helium typically evens out a plasma, however, flowing helium into the plasma region was not sufficient to avoid the collapsing fluorine plasmas described herein. The inclusion of the hydrogen-containing precursor at the early plasma stages avoided the plasma collapse.

The pressure in the plasma region influences the probability of fluorine plasma collapse. At lower pressures, the fluorine plasma may remain uniform without the initial presence of a hydrogen-containing precursor. Increasing the pressure in the fluorine plasma increases the likelihood of fluorine plasma collapse and may relate to the high electronegativity of the fluorine atoms and the reduction of mean free path. According to embodiments, the pressure in the plasma region may be greater than 2 Torr, greater than 3 Torr, greater than 4 Torr, greater than 5 Torr, greater than 6 Torr, or greater than 7 Torr.

The plasma power applied to the plasma region also influences the probability of fluorine plasma collapse. Increased plasma power may also lead to higher probability of fluorine plasma. Including the early exposure to hydrogen as described herein has led to stable plasmas at high plasma powers. The RF plasma power may be greater than 200 watts, greater than 300 watts, greater than 400 watts, greater than 500 watts, or greater than 750 watts in embodiments.

According to embodiments, the first gas may be a hydrogen-containing precursor and the second gas may be a fluorine-containing precursor. Alternatively, the first gas may be a hydrogen fluorine combination with a first atomic concentration ratio and the second gas may have a second atomic concentration ratio. The second atomic concentration ratio may be different from the first atomic concentration ratio. Such a configuration enables a subtle adjustment to process uniformity in general, in embodiments, and the first gas and the second gas may both be present throughout a substrate processing duration in this case. The hydrogen-containing precursor may be one of hydrogen ($H_2$) and ammonia ($NH_3$) and the fluorine-containing precursor may be nitrogen trifluoride ($NF_3$).

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate processing system comprising:
a zonal distribution manifold having a first manifold channel and a second manifold channel;
a zonal distribution plate, wherein the zonal distribution plate has an inner zone channel fluidly coupled with the first manifold channel and an outer zone channel fluidly coupled with the second manifold channel;
a zonal blocker plate, wherein the zonal blocker plate defines an inner recess within the zonal blocker plate and an outer recess within the zonal blocker plate radially outward of and extending about the inner recess, wherein a dividing wall is defined by the zonal blocker plate between the inner recess and the outer recess; and
a faceplate.

2. The substrate processing system of claim 1, wherein an outlet of the second manifold channel is disposed radially outward of an outlet of the first manifold channel.

3. The substrate processing system of claim 2, wherein the zonal distribution plate defines a groove in a first surface of the zonal distribution plate facing the zonal distribution manifold, and wherein the groove is fluidly coupled with the second manifold channel.

4. The substrate processing system of claim 3, wherein the groove extends to the outer zone channel, and wherein the outer zone channel is a plurality of apertures extending through the zonal distribution plate.

5. The substrate processing system of claim 4, wherein the plurality of apertures are radially distributed about the inner zone channel through the zonal distribution plate fluidly coupled with the first manifold channel.

6. The substrate processing system of claim 5, wherein the groove forms a recursive path extending to the plurality of apertures extending through the zonal distribution plate.

7. The substrate processing system of claim 6, wherein a path length along the groove to each aperture of the plurality of apertures extending through the zonal distribution plate is equal.

8. The substrate processing system of claim 1, further comprising:
a showerhead parallel to the faceplate, and
a power supply operably coupled to generate a plasma between the faceplate and the showerhead.

9. The substrate processing system of claim 8, further comprising:
a dielectric insert disposed between the faceplate and the showerhead.

10. The substrate processing system of claim 1, wherein the inner recess defined in the zonal blocker plate is a first inner recess defined in a first surface of the zonal blocker plate facing the zonal distribution plate, and wherein the outer recess defined in the zonal blocker plate is a first outer recess defined in the first surface of the zonal blocker plate.

11. The substrate processing system of claim 10, wherein the zonal blocker plate defines a second inner recess in a second surface of the zonal blocker plate opposite the first surface of the zonal blocker plate, and wherein the zonal blocker plate defines a second outer recess in the second surface of the zonal blocker plate.

12. The substrate processing system of claim 11, wherein the second outer recess is fluidly accessible from the first outer recess via a plurality of apertures through the zonal blocker plate.

13. The substrate processing system of claim 11, wherein the first inner recess and the second inner recess define a central channel through the zonal blocker plate.

14. The substrate processing system of claim 13, further comprising:
an insert disposed within the central channel through the zonal blocker plate.

15. The substrate processing system of claim 14, wherein the insert defines an aperture providing fluid access through the inner recess of the zonal blocker plate.

16. A substrate processing system comprising:
a distribution plate defining a first channel and a second channel fluidly isolated from the first channel; and
a blocker plate positioned adjacent the distribution plate, wherein the blocker plate defines an inner recess within the blocker plate and an outer recess within the blocker plate radially outward of and extending about the inner recess, wherein a dividing wall is defined by the blocker plate between the inner recess and the outer recess.

17. The substrate processing system of claim 16, wherein the distribution plate defines a groove in a first surface of the distribution plate, wherein the groove extends to a plurality of apertures of the second channel extending through the distribution plate, and wherein the groove forms a recursive path extending to the plurality of apertures extending through the distribution plate.

18. The substrate processing system of claim 16, wherein the inner recess through the blocker plate is a central channel extending through the blocker plate.

19. The substrate processing system of claim 18, further comprising:
- an insert disposed within the central channel through the blocker plate.

20. A substrate processing system comprising:
- a distribution manifold defining a first manifold channel and a second manifold channel;
- a distribution plate coupled with the distribution manifold, wherein the distribution plate defines a first channel and a second channel fluidly isolated from the first channel;
- a faceplate defining through-holes;
- a blocker plate positioned between the distribution plate and the faceplate, wherein the blocker plate is characterized by a first surface adjacent the distribution plate and a second surface opposite the first surface, wherein the blocker plate defines an inner recess within the first surface of the blocker plate and an outer recess within the first surface of the blocker plate radially outward of and extending about the inner recess, wherein a dividing wall is defined by the blocker plate between the inner recess and the outer recess, and wherein the inner recess through the blocker plate is a central channel extending through the blocker plate; and
- an insert disposed within the central channel through the blocker plate.

* * * * *